(12) United States Patent
Yosui et al.

(10) Patent No.: US 9,608,304 B2
(45) Date of Patent: Mar. 28, 2017

(54) HIGH-FREQUENCY SIGNAL TRANSMISSION LINE, ELECTRONIC DEVICE AND MANUFACTURING METHOD OF HIGH-FREQUENCY SIGNAL TRANSMISSION LINE

(71) Applicant: Murata Manufacturing Co., Ltd., Nagaokakyo-shi, Kyoto-fu (JP)

(72) Inventors: Kuniaki Yosui, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 235 days.

(21) Appl. No.: 14/619,350

(22) Filed: Feb. 11, 2015

(65) Prior Publication Data
US 2015/0155611 A1    Jun. 4, 2015

Related U.S. Application Data

(63) Continuation of application No. PCT/JP2014/052740, filed on Feb. 6, 2014.

(30) Foreign Application Priority Data

Feb. 13, 2013 (JP) ................................ 2013-025636

(51) Int. Cl.
*H01P 3/08* (2006.01)
*H05K 3/00* (2006.01)
(Continued)

(52) U.S. Cl.
CPC ............ *H01P 3/085* (2013.01); *H01P 11/003* (2013.01); *H05K 1/025* (2013.01); *H05K 1/0253* (2013.01);
(Continued)

(58) Field of Classification Search
CPC ... H05K 3/00; H01P 3/08; H01P 3/081; H01P 3/082; H01P 3/085; H01P 3/087
(Continued)

(56) References Cited

U.S. PATENT DOCUMENTS

2002/0135444 A1    9/2002    Ida et al.
2012/0274423 A1    11/2012   Kato
2013/0127560 A1    5/2013    Kato et al.

FOREIGN PATENT DOCUMENTS

JP    2000-114827 A    4/2000
JP    2002-299918 A    10/2002
(Continued)

OTHER PUBLICATIONS

Official Communication issued in International Patent Application No. PCT/JP2014/052740, mailed on Apr. 28, 2014.

*Primary Examiner* — Stephen E Jones
(74) *Attorney, Agent, or Firm* — Keating & Bennett, LLP

(57) ABSTRACT

A high-frequency signal transmission line includes a dielectric body including dielectric layers stacked together, a linear signal line provided in the dielectric body, a first ground conductor provided at the dielectric body, at a first side of the signal line in a stacking direction so as to face the signal line, and a subsidiary member provided at the dielectric body, at a second side of the signal line in the stacking direction so as to face a central portion of the signal line in a line-width direction. In a sectional view along a plane perpendicular or substantially perpendicular to an extending direction of the signal line, the signal line is curved such that side portions of the signal line in the line-width direction are farther away from the first ground conductor than a central portion of the signal line in the line-width direction.

7 Claims, 18 Drawing Sheets

(51) Int. Cl.
  *H01P 11/00* (2006.01)
  *H01P 1/203* (2006.01)
  *H05K 1/02* (2006.01)
  *H05K 1/14* (2006.01)

(52) U.S. Cl.
  CPC ........... *H05K 3/00* (2013.01); *H01P 1/20363* (2013.01); *H05K 1/0225* (2013.01); *H05K 1/147* (2013.01); *H05K 2201/09618* (2013.01); *H05K 2201/09736* (2013.01); *H05K 2201/09781* (2013.01); *H05K 2201/10189* (2013.01); *Y10T 29/49117* (2015.01)

(58) Field of Classification Search
  USPC .............................. 333/1, 4, 5, 33, 238, 246
  See application file for complete search history.

(56) References Cited

FOREIGN PATENT DOCUMENTS

| | | |
|---|---|---|
| JP | 2010-098412 A | 4/2010 |
| WO | 2012/073591 A1 | 6/2012 |
| WO | 2012/074100 A1 | 6/2012 |

F I G. 1
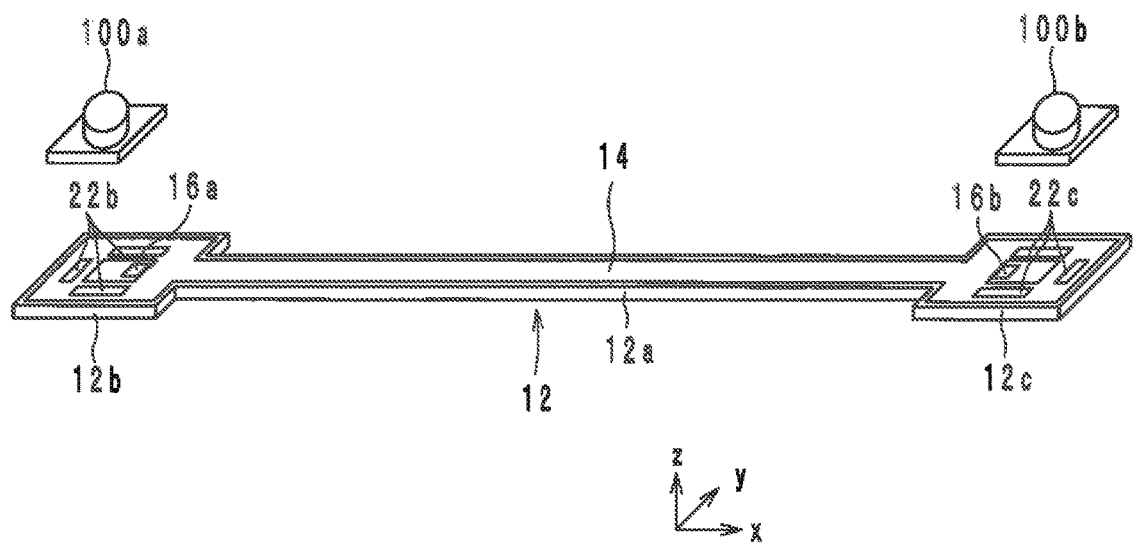

F I G. 10
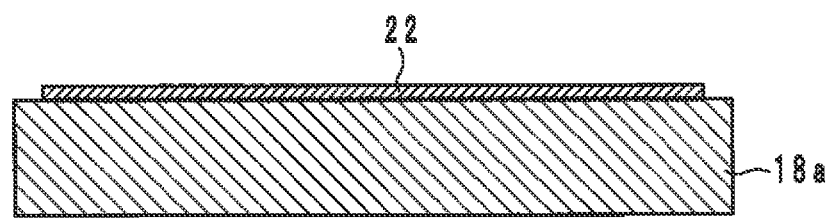
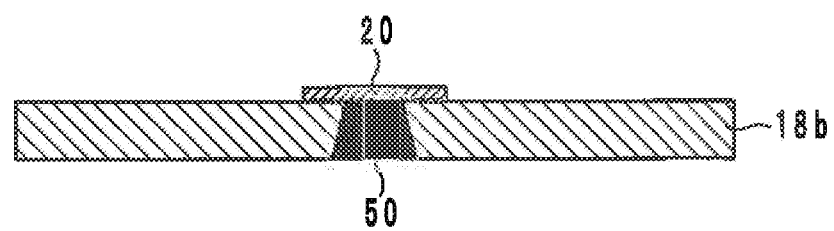
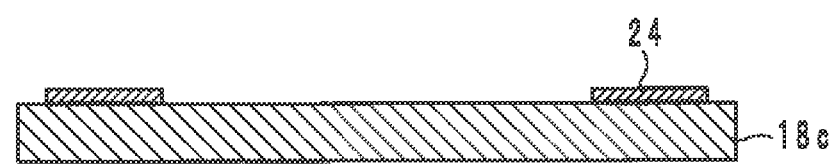

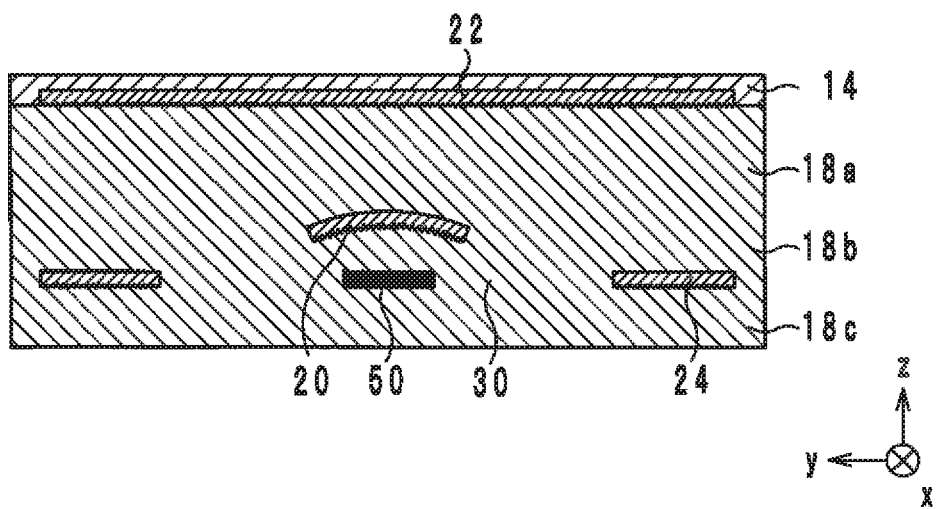
F I G . 1 8

HIGH-FREQUENCY SIGNAL TRANSMISSION LINE, ELECTRONIC DEVICE AND MANUFACTURING METHOD OF HIGH-FREQUENCY SIGNAL TRANSMISSION LINE

BACKGROUND OF THE INVENTION

1. Field of the Invention

The present invention relates to a high-frequency signal transmission line, an electronic device and a manufacturing method of the high-frequency signal transmission line, and more particularly to a high-frequency signal transmission line preferably for use in high-frequency signal transmission, an electronic device and a manufacturing method of the high-frequency signal transmission line.

2. Description of the Related Art

As a conventional high-frequency signal transmission line, for example, a high-frequency signal line disclosed in WO 2012/073591 is known.

The high-frequency signal line disclosed in WO 2012/073591 includes a dielectric body, a signal line and two ground conductors. The dielectric body is a laminate of dielectric sheets. The signal line is located in the dielectric body. The two ground conductors are located in the dielectric body so as to sandwich the signal line in the direction of lamination. Accordingly, the signal line and the ground conductors form a stripline structure.

The high-frequency signal line disclosed in WO 2012/073591 has a problem of having a great insertion loss. Specifically, the signal line has a rectangular or substantially rectangular cross-sectional shape. Therefore, lines of electric force generated between the signal line and the ground conductors concentrate on the edges of the signal line because of an edge effect. Accordingly, a current flows not entirely in the signal line but intensively in narrow areas near the edges of the signal line. This results in a great insertion loss.

SUMMARY OF THE INVENTION

Preferred embodiments of the present invention provide a high-frequency signal transmission line that significantly reduces or prevents insertion loss, an electronic device and a manufacturing method of the high-frequency signal transmission line.

A high-frequency signal transmission line according to a first aspect of various preferred embodiments of the present invention includes a dielectric body including dielectric layers stacked together; a linear signal line provided in the dielectric body; a first ground conductor provided at the dielectric body, at a first side of the signal line in a stacking direction so as to face the signal line; and a subsidiary member provided at the dielectric body, at a second side of the signal line in the stacking direction so as to face a central portion of the signal line in a line-width direction. In a sectional view along a plane perpendicular or substantially perpendicular to an extending direction of the signal line, the signal line is curved such that side portions of the signal line in the line-width direction are farther away from the first ground conductor than a central portion of the signal line in the line-width direction.

An electronic device according to the first aspect of various preferred embodiments of the present invention includes a high-frequency signal transmission line, and a case housing the high-frequency signal transmission line. The high-frequency signal transmission line includes a dielectric body including dielectric layers stacked together; a linear signal line provided in the dielectric body; a first ground conductor provided at the dielectric body, at a first side of the signal line in a stacking direction so as to face the signal line; and a subsidiary member provided at the dielectric body, at a second side of the signal line in the stacking direction so as to face a central portion of the signal line in a line-width direction. In a sectional view along a plane perpendicular or substantially perpendicular to an extending direction of the signal line, the signal line is curved such that side portions of the signal line in the line-width direction are farther away from the first ground conductor than a central portion of the signal line in the line-width direction.

A manufacturing method according to the first aspect of various preferred embodiments of the present invention is a method for manufacturing a high-frequency signal transmission line that includes a dielectric body including dielectric layers stacked together; a linear signal line provided in the dielectric body; a first ground conductor provided at the dielectric body, at a first side of the signal line in a stacking direction so as to face the signal line; and a subsidiary member provided at the dielectric body, at a second side of the signal line in the stacking direction so as to face a central portion of the signal line in a line-width direction. In the method, while the dielectric body is pressed from both sides in the stacking direction, the subsidiary member presses the central portion of the signal line in the line-width direction, thus curving the signal line.

A high-frequency signal transmission line according to a second aspect of various preferred embodiments of the present invention includes a dielectric body including dielectric layers stacked together; a linear signal line provided in the dielectric body; a first ground conductor provided at the dielectric body, at a first side of the signal line in a stacking direction so as to face the signal line; and a hollow space provided in the dielectric body, at a second side of the signal line in the stacking direction so as to face a central portion of the signal line in a line-width direction. In a sectional view along a plane perpendicular or substantially perpendicular to an extending direction of the signal line, the signal line is curved such that side portions of the signal line in the line-width direction are farther away from the first ground conductor than a central portion of the signal line with respect to the line-width direction.

An electronic device according to the second aspect of various preferred embodiments of the present invention includes a high-frequency signal transmission line, and a case housing the high-frequency signal transmission line. The high-frequency signal transmission line includes a dielectric body including dielectric layers stacked together; a linear signal line provided in the dielectric body; a first ground conductor provided at the dielectric body, at a first side of the signal line in a stacking direction so as to face the signal line; and a hollow space provided in the dielectric body, at a second side of the signal line in the stacking direction so as to face a central portion of the signal line in a line-width direction. In a sectional view along a plane perpendicular or substantially perpendicular to an extending direction of the signal line, the signal line is curved such that side portions of the signal line in the line-width direction are farther away from the first ground conductor than a central portion of the signal line in the line-width direction.

A manufacturing method according to the second aspect of various preferred embodiments of the present invention is a method for manufacturing a high-frequency signal transmission line that includes a dielectric body including dielectric layers stacked together; a linear signal line provided in the dielectric body; and a first ground conductor provided at the dielectric body, at a first side of the signal line in a stacking direction so as to face the signal line. In the method, a subsidiary member is provided at the dielectric body, at the second side of the signal line so as to face the signal line. While the dielectric body is pressed from both sides in the stacking direction and heated, the subsidiary member presses a central portion of the signal line in a line-width direction, thus curving the signal line. The subsidiary member disappears while the dielectric body is heated.

Various preferred embodiments of the present invention significantly reduce or prevent insertion loss.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a perspective view of a high-frequency signal transmission line according to a preferred embodiment of the present invention.

FIG. 10 is a sectional view of the dielectric body illustrating lamination thereof.

FIG. 18 is a sectional view of the high-frequency signal transmission line along the line B-B indicated in FIG. 17.

DETAILED DESCRIPTION OF THE PREFERRED EMBODIMENTS

High-frequency signal transmission lines, electronic devices and manufacturing methods of the high-frequency signal transmission lines according to some preferred embodiments of the present invention are hereinafter described with reference to the drawings.

Figure 2:
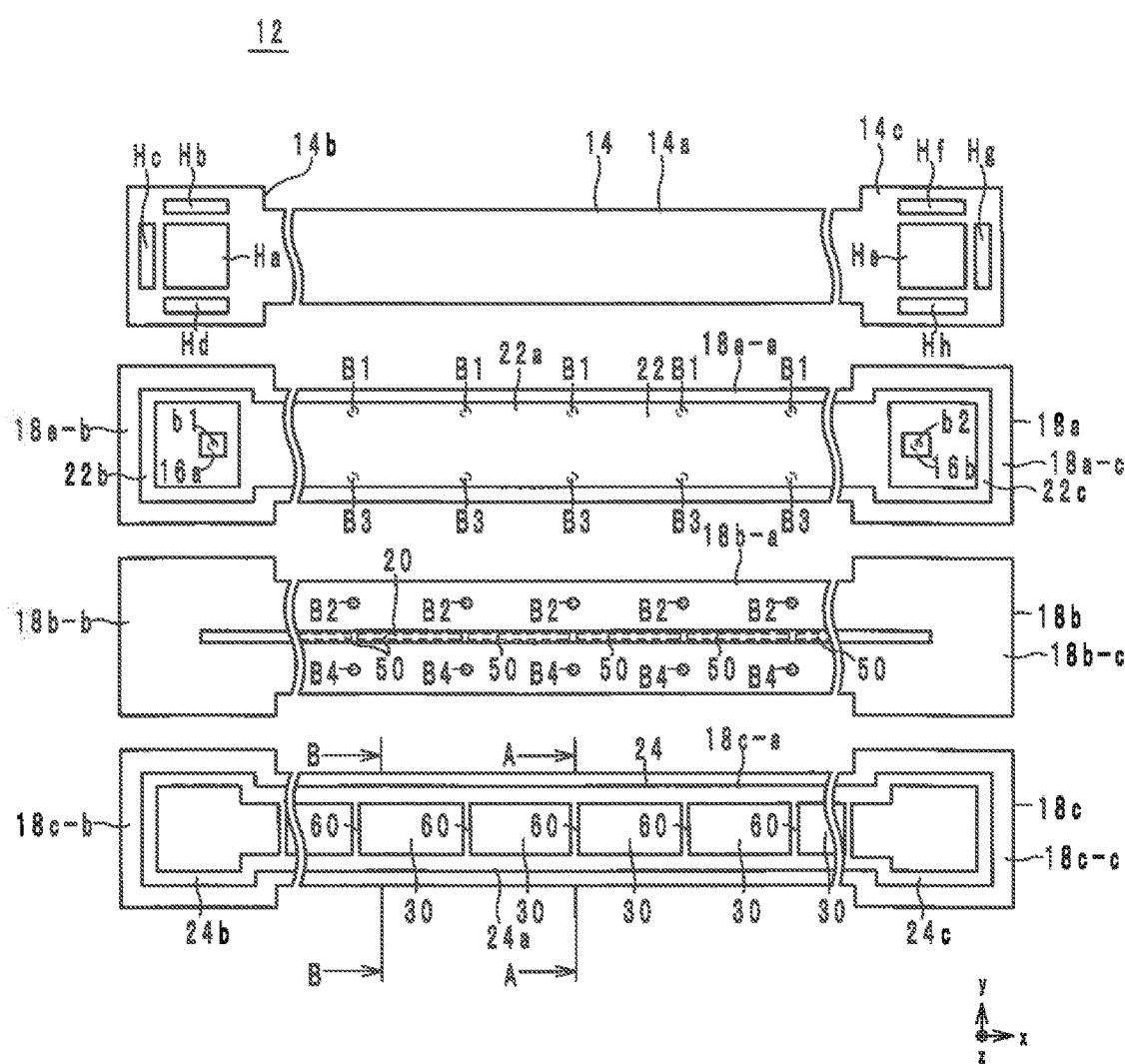
FIG. 2 is an exploded view of a dielectric body of the high-frequency signal transmission line illustrated in FIG. 1.
Figure 3:
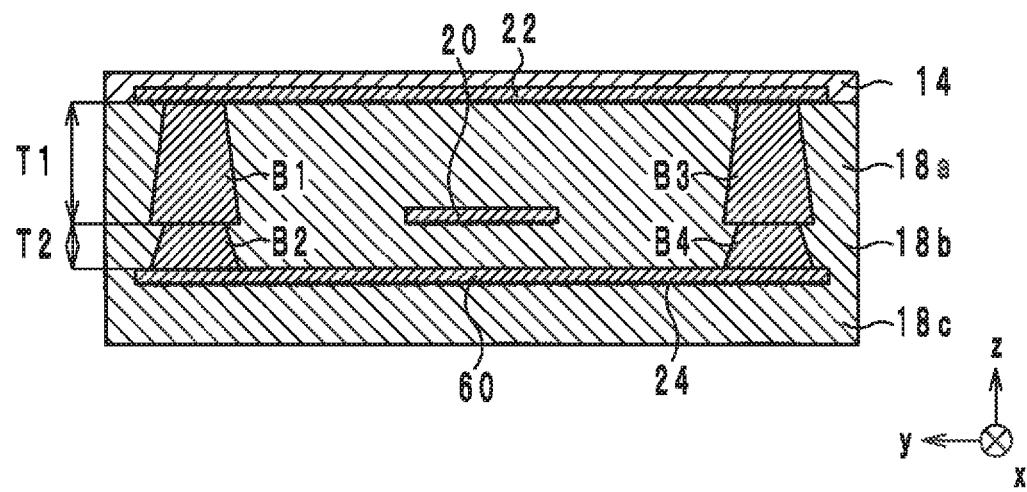
FIG. 3 is a sectional view of the high-frequency signal transmission line along the line A-A indicated in FIG. 2.
Figure 4:
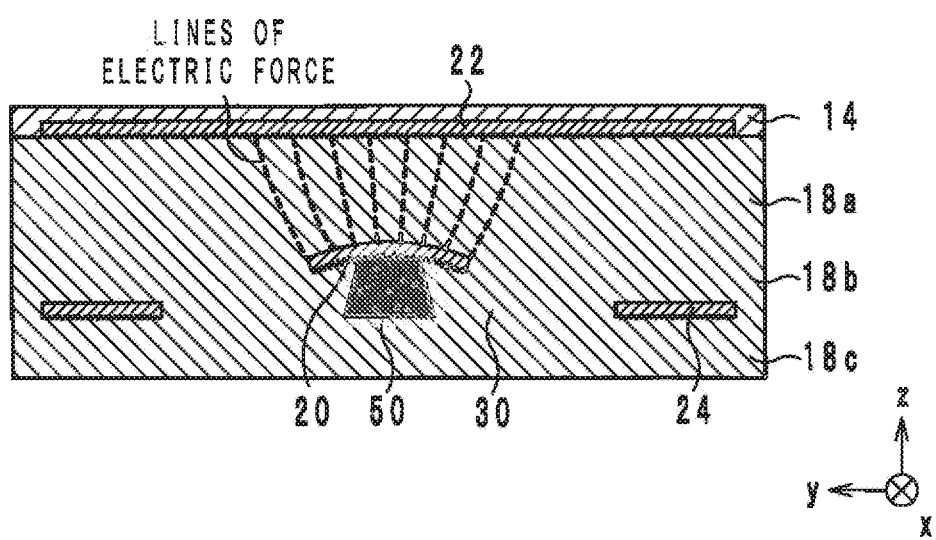
FIG. 4 is a sectional view of the high-frequency signal transmission line along the line B-B indicated in FIG. 2.

Example structures of a high-frequency signal transmission line 10 according to various preferred embodiments of the present invention is described with reference to the drawings. FIG. 1 is a perspective view of the high-frequency signal transmission line 10 according to a preferred embodiment of the present invention. FIG. 2 is an exploded view of a dielectric body 12 of the high-frequency signal transmission line 10. FIG. 3 is a sectional view of the high-frequency signal transmission line 10 along the line A-A indicated in FIG. 2. FIG. 4 is a sectional view of the high-frequency signal transmission line 10 along the line B-B indicated in FIG. 2. In the following, the stacking direction of the high-frequency signal transmission line 10 is defined as the z-direction. The lengthwise direction of the high-frequency signal transmission line 10 is defined as the x-direction. The direction perpendicular or substantially perpendicular to the z-direction and the x-direction is defined as the y-direction.

The high-frequency signal transmission line 10 is preferably used, for example, in an electronic device, such as a cell phone or the like, to connect two high-frequency circuits. As illustrated in FIGS. 1 and 2, the high-frequency signal transmission line 10 includes a dielectric body 12, external terminals 16a and 16b, a signal line 20, a main ground conductor 22, an auxiliary ground conductor 24, subsidiary members 50, via-hole conductors b1, b2 and B1 through B4, and connectors 100a and 100b.

As seen in FIG. 1, the dielectric body 12 is a flexible plate shaped member extending in the x-direction when viewed from the z-direction. The dielectric body 12 includes a line portion 12a, and connecting portions 12b and 12c. As seen in FIG. 2, the dielectric body 12 includes a protective layer 14 and dielectric sheets 18a through 18c stacked in this order from a positive side to a negative side in the z-direction. The main surface of the dielectric body 12 at the positive side in the z-direction is referred to as a front surface, and the main surface of the dielectric body 12 at the negative side in the z-direction is referred to as a back surface.

As seen in FIG. 2, the line portion 12a is a strip-shaped portion extending in the x-direction. The connecting portions 12b and 12c are rectangular or substantially rectangular portions connected to the negative end in the x-direction and the positive end in the x-direction, respectively, of the line portion 12a. The widths (sizes in the y-direction) of the connecting portions 12b and 12c are greater than the width (size in the y-direction) of the line portion 12a.

As illustrated in FIG. 2, the dielectric sheets 18a through 18c extend in the x-direction and have the same shape as the dielectric body 12 when viewed from the z-direction. The dielectric sheets 18a through 18c are preferably made of flexible thermoplastic resin, such as polyimide, liquid polymer or the like, for example.

As seen in FIG. 3, the thickness T1 of the dielectric sheet 18a is greater than the thickness T2 of the dielectric sheet 18b. After lamination of the dielectric sheets 18a through 18c, the thickness T1 preferably is, for example, within a range from about 50 μm to about 300 μm. In this preferred embodiment, the thickness T1 preferably is about 100 μm, for example. The thickness T2 preferably is, for example, within a range from about 10 μm to about 100 μm. In this preferred embodiment, the thickness T2 preferably is about 50 μm, for example.

The dielectric sheet 18a includes a line portion 18a-a, and connecting portions 18a-b and 18a-c. The dielectric sheet 18b includes a line portion 18b-a, and connecting portions 18b-b and 18b-c. The dielectric sheet 18c includes a line portion 18c-a, and connecting portions 18c-b and 18c-c. The line portions 18a-a, 18b-a and 18c-a constitute the line portion 12a of the dielectric body 12. The connecting portions 18a-b, 18b-b and 18c-b constitute the connecting portion 12b of the dielectric body 12. The connecting portions 18a-c, 18b-c and 18c-c constitute the connecting portion 12c of the dielectric body 12.

As seen in FIG. 2, the signal line 20 is a linear conductor located in the dielectric body 12, and a high-frequency signal is transmitted through the signal line 20. In this preferred embodiment, the signal line 20 is provided on a front surface of the dielectric sheet 18b. The signal line 20 extends in the x-direction on the line portion 18b-a. The negative end in the x-direction of the signal line 20 is located in or substantially in the center of the connecting portion 18b-b. The positive end in the x-direction of the signal line 20 is located in or substantially in the center of the connecting portion 18b-c. The line width of the signal line 20 preferably is, for example, within a range from about 300 μm to about 700 μm. In this preferred embodiment, the line width of the signal line 20 preferably is about 300 μm, for example. The signal line 20 preferably is made of a metal material with a low specific resistance including silver or copper. The statement that the signal line 20 is provided on the front surface of the dielectric sheet 18b indicates that the signal line 20 is formed preferably by plating the front surface of the dielectric sheet 18b with a metal foil and preferably by patterning the metal foil or that the signal line 20 is formed preferably by applying a metal foil on the front surface of the dielectric sheet 18b and preferably by patterning the metal foil. The surface of the signal line 20 is smoothened, and therefore, the surface of the signal line 20 in contact with the dielectric sheet 18b has a greater surface roughness than the surface of the signal line 20 out of contact with the dielectric sheet 18b.

The main ground conductor 22 is located at the positive side in the z-direction of the signal line 20. More specifically, the main ground conductor 22 is provided on the front surface of the dielectric sheet 18a so as to face the signal line 20 across the dielectric sheet 18a. The main ground conductor 22 has no openings in a portion overlapping with the signal line 20. The characteristic impedance of the high-frequency signal transmission line 10 depends mainly on the area where the signal line 20 and the main ground conductor 22 face each other, the distance between the signal line 20 and the main ground conductor 22, and the relative permittivity of the dielectric sheets 18a through 18c. For example, in order to achieve approximately 50Ω, for example, as the characteristic impedance of the high-frequency signal transmission line 10, the design is made as follows. The characteristic impedance obtained by the signal line 20 and the main ground conductor 22 is preferably designed to be about 55Ω, for example, which is a little higher than about 50Ω. Further, as will be described later, the shape of the auxiliary ground conductor 24 is adjusted such that the characteristic impedance obtained by the signal line 20, the main ground conductor and the auxiliary ground conductor 24 will be about 50Ω, for example.

In this preferred embodiment, the main ground conductor 22 preferably has no openings. However, the main ground conductor 22 may have openings smaller than openings 30 made in the auxiliary ground conductor 24, for example.

The main ground conductor 22 is preferably formed of a metal material with a low specific resistance including silver or copper. The statement that the main ground conductor 22 is provided on the front surface of the dielectric sheet 18a indicates that the main ground conductor 22 is formed preferably by plating the front surface of the dielectric sheet 18a with a metal foil and preferably by patterning the metal foil or that the main ground conductor 22 is formed preferably by applying a metal foil on the front surface of the dielectric sheet 18a and preferably by patterning the metal foil. The surface of the main ground conductor 22 is smoothened, and therefore, the surface of the main ground conductor 22 in contact with the dielectric sheet 18a has a greater surface roughness than the surface of the main ground conductor 22 out of contact with the dielectric sheet 18a.

The main ground conductor 22 includes a main portion 22a, and terminal portions 22b and 22c. The main portion 22a is a strip-shaped portion provided on the front surface of the line portion 18a-a so as to extend in the x-direction. The main portion 22a is a continuous conductive portion and has no openings in a portion overlapping with the signal line 20. The terminal portion 22b is a rectangular or substantially rectangular-ring-shaped portion provided on the front surface of the connecting portion 18a-b. The terminal portion 22b is connected to the negative end in the x-direction of the main portion 22a. The terminal portion 22c is a rectangular or substantially rectangular-ring-shaped portion provided on the front surface of the connecting portion 18a-c. The terminal portion 22b is connected to the positive end in the x-direction of the main portion 22a.

The auxiliary ground conductor 24 is located at the negative side in the z-direction of the signal line 20. The auxiliary ground conductor 24 includes openings 30 arranged along the signal line 20. Specifically, the auxiliary ground conductor 24 is provided on the front surface of the dielectric sheet 18c so as to face the signal line 20 across the dielectric sheet 18b. The auxiliary ground conductor 24 also defines and functions as a shield.

The auxiliary ground conductor 24 is preferably formed of a metal material with a low specific resistance including silver or copper. The statement that the auxiliary ground conductor 24 is provided on the front surface of the dielectric sheet 18c indicates that the auxiliary ground conductor 24 is formed preferably by plating the front surface of the dielectric sheet 18c with a metal foil and preferably by patterning the metal foil or that the auxiliary ground conductor 24 is formed preferably by applying a metal foil on the front surface of the dielectric sheet 18c and preferably by patterning the metal foil. The surface of the auxiliary ground conductor 24 is smoothened, and therefore, the surface of the auxiliary ground conductor 24 in contact with the dielectric sheet 18c has a greater surface roughness than the surface of the auxiliary ground conductor 24 out of contact with the dielectric sheet 18c.

The auxiliary ground conductor 24 includes a main portion 24a, and terminal portions 24b and 24c. The main portion 24a is a strip-shaped portion provided on the front surface of the line portion 18c-a so as to extend in the x-direction. In the main portion 24a, as seen in FIG. 2, rectangular or substantially rectangular openings 30, each having longer sides extending in the x-direction, are made. Accordingly, the main portion 24a of the auxiliary ground conductor 24 is preferably shaped like a ladder. In the auxiliary ground conductor 24, the portions between the openings 30 are referred to as bridges 60. Each of the bridges 60 extends in the y-direction. When viewed from the z-direction, the openings 30 and the bridges 60 are arranged alternately to overlap with the signal line 20. In this preferred embodiment, the signal line 20 preferably extends in the x-direction, crossing or substantially crossing the centers of the openings 30 and the bridges 60 in the y-direction.

The terminal portion 24b is a rectangular or substantially rectangular-ring-shaped portion provided on the front surface of the connecting portion 18c-b. The terminal portion 24b is connected to the negative end in the x-direction of the main portion 24a. The terminal portion 24c is a rectangular or substantially rectangular-ring-shaped portion provided on the front surface of the connecting portion 18c-c. The terminal portion 24c is connected to the positive end in the x-direction of the main portion 24a.

As mentioned above, the auxiliary ground conductor 24 is configured for fine adjustment such that the characteristic impedance of the high-frequency signal transmission line 10 will be about 50Ω, for example. The intervals (in the x-direction) between the bridges 60 of the auxiliary ground conductor 24 are designed such that radiation noise will not occur in the used band.

As seen in FIGS. 1 and 2, the external terminal 16a is a rectangular or substantially rectangular conductor provided on the front surface of the connecting portion 18a-b of the dielectric sheet 18a, in or substantially in the center. When viewed from the z-direction, the external terminal 16a overlaps with the negative end in the x-direction of the signal line 20. As seen in FIGS. 1 and 2, the external terminal 16b is a rectangular or substantially rectangular conductor provided on the front surface of the connecting portion 18a-c of the dielectric sheet 18a, in or substantially in the center. When viewed from the z-direction, the external terminal 16b overlaps with the positive end in the x-direction of the signal line 20.

The external terminals 16a and 16b are preferably formed of a metal material with a low specific resistance including silver or copper. The external terminals 16a and 16b are preferably plated with Ni/Au. The statement that the external terminals 16a and 16b are provided on the front surface of the dielectric sheet 18a indicates that the external terminals 16a and 16b are formed preferably by plating the front surface of the dielectric sheet 18a with a metal foil and preferably by patterning the metal foil or that the external terminals 16a and 16b are formed preferably by applying a metal foil on the front surface of the dielectric sheet 18a and preferably by patterning the metal foil. The surfaces of the external terminals 16a and 16b are smoothened, and therefore, the surfaces of the external terminals 16a and 16b in contact with the dielectric sheet 18a have a greater surface roughness than the surfaces of the external terminals 16a and 16b out of contact with the dielectric sheet 18c.

As thus far described, the signal line 20 is provided between the main ground conductor 22 and the auxiliary ground conductor 24 in the z-direction. Accordingly, the signal line 20, the main ground conductor 22 and the auxiliary ground conductor 24 define a triplate type stripline structure. Since the openings 30 are made in the auxiliary ground conductor 24, the area where the auxiliary ground conductor 24 faces the signal line 20 is smaller than the area where the main ground conductor 22 faces the signal line 20.

As seen in FIGS. 3 and 4, the interval (distance in the z-direction) between the signal line 20 and the main ground conductor 22 is equal or substantially equal to the thickness T1 of the dielectric sheet 18a and, for example, preferably within a range from about 50 μm to about 300 μm. In this preferred embodiment, the interval between the signal line 20 and the main ground conductor 22 preferably is about 100 μm, for example. As seen in FIGS. 3 and 4, the interval (distance in the z-direction) between the signal line 20 and the auxiliary ground conductor 24 is equal or substantially equal to the thickness T2 of the dielectric sheet 18b and, for example, preferably within a range from about 10 μm to about 100 μm. In this preferred embodiment, the interval between the signal line 20 and the auxiliary ground conductor 24 is preferably about 50 μm, for example. Thus, the distance in the z-direction between the main ground conductor 22 and the signal line 20 is greater than the distance in the z-direction between the auxiliary ground conductor 24 and the signal line 20. Also, as will be described later, the distance between each side of the signal line 20 in the line-width direction and the main ground conductor 22 is slightly greater than the center of the signal line 20 in the line-width direction and the main ground conductor 22.

The via-hole conductor b1 is pierced in the connecting portion 18a-b of the dielectric sheet 18a in the z-direction so as to connect the external terminal 16a to the negative end in the x-direction of the signal line 20. The via-hole conductor b2 is pierced in the connecting portion 18a-c of the dielectric sheet 18a in the z-direction so as to connect the external terminal 16b to the positive end in the x-direction of the signal line 20. Thus, the signal line 20 is connected between the external terminals 16a and 16b. The via-hole conductors b1 and b2 are preferably provided by making through holes in the dielectric sheet 18a and by filling the through holes with a metal material.

The via-hole conductors B1 are pierced in the line portion 18a-a of the dielectric sheet 18a in the z-direction. Specifically, as seen in FIG. 2, the via-hole conductors B1 are located at the positive side in the y-direction of the respective bridges 60 and are aligned in the x-direction. The via-hole conductors B2 are pierced in the line portion 18b-a of the dielectric sheet 18b in the z-direction. Specifically, as seen in FIG. 2, the via-hole conductors B2 are located at the positive side in the y-direction of the respective bridges 60 and are aligned in the x-direction. The via-hole conductors B1 are connected to their respective adjacent via-hole conductors B2, and each connected pair of via-hole conductors B1 and B2 defines and functions as one via-hole conductor. Thus, the via-hole conductors B1 and B2 connect the main ground conductor 22 and the auxiliary ground conductor 24 to each other. The via-hole conductors B1 and B2 are preferably provided by making through holes in the dielectric sheets 18a and 18b and by filling the through holes with a metal material.

The via-hole conductors B3 are pierced in the line portion 18a-a of the dielectric sheet 18a in the z-direction. Specifically, as seen in FIG. 2, the via-hole conductors B3 are located at the negative side in the y-direction of the respective bridges 60 and are aligned in the x-direction. The via-hole conductors B4 are pierced in the line portion 18b-a of the dielectric sheet 18b in the z-direction. Specifically, as seen in FIG. 2, the via-hole conductors B2 are located at the negative side in the y-direction of the respective bridges 60 and are aligned in the x-direction. The via-hole conductors B3 are connected to their respective adjacent via-hole conductors B4, and each connected pair of via-hole conductors B3 and B4 defines and functions as one via-hole conductor. Thus, the via-hole conductors B3 and B4 connect the main ground conductor 22 and the auxiliary ground conductor 24 to each other. The via-hole conductors B3 and B4 are preferably provided by making through holes in the dielectric sheets 18a and 18b and by filling the through holes with a metal material.

The protective layer 14 is an insulating layer covering substantially the entire front surface of the dielectric sheet 18a. Accordingly, the protective layer 14 covers the main ground conductor 22. The protective layer 14 is preferably formed of flexible resin, such as a resist material or the like, for example.

As seen in FIG. 2, the protective layer 14 includes a line portion 14a, and connecting portions 14b and 14c. The line portion 14a covers the entire front surface of the line portion 18a-a and accordingly covers the main portion 22a.

The connecting portion 14b is connected to the negative end in the x-direction of the line portion 14a and covers the front surface of the connecting portion 18a-b. The connecting portion 14b preferably includes openings Ha through Hd. The opening Ha is a rectangular or substantially rectangular opening made in the center of the connecting portion 14b. The external terminal 16a is exposed to the outside through the opening Ha. The opening Hb is a rectangular or substantially rectangular opening located at the positive side in the y-direction of the opening Ha. The opening Hc is a rectangular or substantially rectangular opening located at the negative side in the x-direction of the opening Ha. The opening Hd is a rectangular or substantially rectangular opening located at the negative side in the y-direction of the opening Ha. The terminal portion 22b of the main ground conductor 22 is exposed to the outside through the openings Hb through Hd so as to function as an external terminal.

The connecting portion 14c is connected to the positive end in the x-direction of the line portion 14a and covers the front surface of the connecting portion 18a-c. The connecting portion 14c preferably includes openings He through Hh. The opening Ha is a rectangular or substantially rectangular opening made in the center of the connecting portion 14c. The external terminal 16b is exposed to the outside through the opening He. The opening Hf is a rectangular or substantially rectangular opening located at the positive side in the y-direction of the opening He. The opening Hg is a rectangular or substantially rectangular opening located at the positive side in the x-direction of the opening He. The opening Hh is a rectangular or substantially rectangular opening located at the negative side in the y-direction of the opening He. The terminal portion 22c of the main ground conductor 22 is exposed to the outside through the openings Hf through Hh so as to function as an external terminal.

In order to reduce the insertion loss, the high-frequency signal transmission line 10 includes subsidiary members 50. As seen in FIGS. 2 and 4, the subsidiary members 50 are located in the dielectric body 12, and specifically, at the negative side in the z-direction of the signal line 20 so as to face the central portion of the signal line 20 in the line-width direction (y-direction). In this preferred embodiment, the subsidiary members 50 pierce the dielectric sheet 18b in the z-direction so as to contact with the back surface of the signal line 20.

The subsidiary members 50 extend in the x-direction along the signal line 20. The line widths of the subsidiary members 50 are smaller than that of the signal line 20. Accordingly, the subsidiary members 50 face the central portion of the signal line 20 in the line-width direction and do not face either side of the signal line 20 in the line-width direction.

The subsidiary members 50 overlap with the openings 30 and do not overlap with the bridges 60 when viewed from the z-direction. Accordingly, the subsidiary members 50 do not overlap with the auxiliary ground conductor 24 when viewed from the z-direction. Therefore, there is no risk that the subsidiary members 50 contact with the auxiliary ground conductor 24. The subsidiary members 50 are preferably formed of a more rigid material than the dielectric sheets 18a through 18c. Specifically, the subsidiary members 50 are preferably formed of a conductive metal material, such as Sn—Cu, Sn—Ag or the like, for example.

Since the subsidiary members 50 are provided, the signal line 20 is curved as illustrated in FIG. 4. More specifically, the central portion of the signal line 20 in the line-width direction overlaps with the subsidiary members 50. The subsidiary members 50 are preferably formed of a more rigid material than the dielectric sheets 18a through 18c. Therefore, during a pressure-bonding process to form the dielectric body 12, the subsidiary members 50 push in the positive z-direction the central portion of the signal line 20 in the line-width direction. Consequently, as seen in a sectional view of the signal line 20 along a plane perpendicular or substantially perpendicular to the extending direction (x-direction) of the signal line 20, the signal line 20 is curved such that the side portions of the signal line 20 in the line-width direction are farther away from the main ground conductor 22 than the central portion of the signal line 20 in the line-width direction. Thus, the signal line 20 is curved such that the center portion in the line-width direction protrudes in the positive z-direction.

Also, since the subsidiary members 50 are conductors and are electrically connected to the signal line 20, the DC resistance value in the high-frequency signal transmission line 10 becomes smaller.

In the high-frequency signal transmission line 10 having the structure above, the characteristic impedance of the signal line 20 changes cyclically between an impedance value Z1 and an impedance value Z2. More specifically, in the areas where the signal line 20 overlaps with the openings 30, relatively small capacitance is generated between the signal line 20 and the main ground conductor 22 and between the signal line 20 and the auxiliary ground conductor 24. Accordingly, the characteristic impedance in the areas where the signal line 20 overlaps with the openings 30 is of a relatively high value Z1.

In the areas where the signal line 20 overlaps with the bridges 60, relatively large capacitance is generated between the signal line 20 and the main ground conductor 22 and between the signal line 20 and the auxiliary ground conductor 24. Accordingly, the characteristic impedance in the areas where the signal line 20 overlaps with the bridges 60 is of a relatively low value Z2. The openings 30 and the bridges 60 are arranged alternately in the x-direction. Therefore, the characteristic impedance of the signal line 20 changes cyclically between the value Z1 and the value Z2. The impedance value Z1 preferably is, for example, about 55Ω, and the impedance value Z2 preferably is, for example, about 45Ω. The average characteristic impedance of the whole signal line 20 preferably is, for example, about 50Ω.

Figure 5:
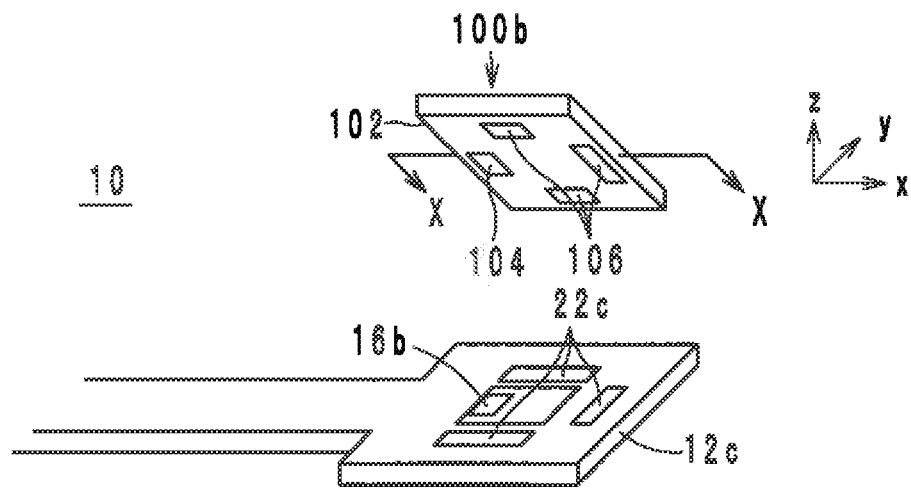
FIG. 5 is a perspective view of a connector of the high-frequency signal transmission line.

The connectors 100a and 100b are, as illustrated in FIG. 1, mounted on the front surfaces of the connecting portions 12b and 12c, respectively. The connectors 100a and 100b have the same structure, and in the following, the structure of the connector 100b is described as an example. FIG. 5 is a perspective view of the connector 100b of the high-frequency signal transmission line 10. FIG. 10 is a sectional view of the connector 100b of the high-frequency signal transmission line 10.

Figure 6:
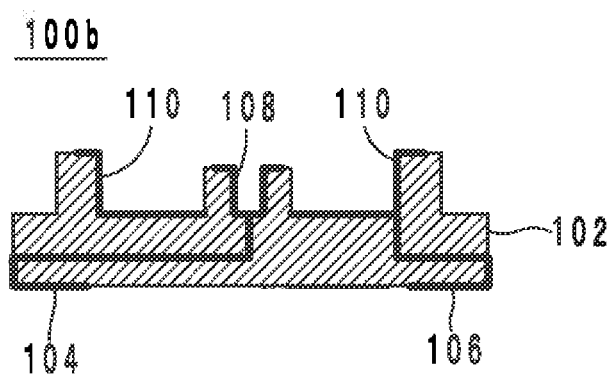
FIG. 6 is a sectional view of the connector of the high-frequency signal transmission line.

The connector 100b, as illustrated in FIGS. 1, 5 and 6, includes a connector body 102, external terminals 104 and 106, a central conductor 108 and an external conductor 110. The connector body 102 is preferably in the shape of a rectangular or substantially rectangular plate with a cylinder connected thereon, and is preferably formed of an insulating material such as resin.

The external terminal 104 is provided on the surface of the plate shaped portion of the connector body 102 at the negative side in the z-direction so as to face the external terminal 16b. The external terminal 106 is provided on the surface of the plate shaped portion of the connector body 102 at the negative side in the z-direction so as to face the terminal portion 22c exposed through the openings Hf through Hh.

The central conductor 108 is located in the center of the cylindrical portion of the connector body 102 and is connected to the external terminal 104. The central conductor 108 is a signal terminal at which a high-frequency signal is input or output. The external conductor 110 is provided on the inner surface of the cylindrical portion of the connector body 102 and is connected to the external terminal 106. The external conductor 110 is aground terminal that is maintained at a ground potential.

The connector 100b having the structure above is, as illustrated in FIG. 5, mounted on the front surface of the connecting portion 12c such that the external terminal 104 is connected to the external terminal 16b and such that the external terminal 106 is connected to the terminal portion 22c. Thus, the signal line 20 is electrically connected to the central conductor 108, and the main ground conductor 22 and the auxiliary ground conductor 24 are electrically connected to the external conductor 110.

The connectors 100a and 100b do not necessarily need to be provided. Alternatively, the external terminals 104 and 106 may be provided on the front surfaces of the connecting portions 12b and 12c, respectively, such that the signal line 20 and the ground conductors 22 and 24 are capable of being connected to an external device through the external terminals 104 and 106.

Figure 7:
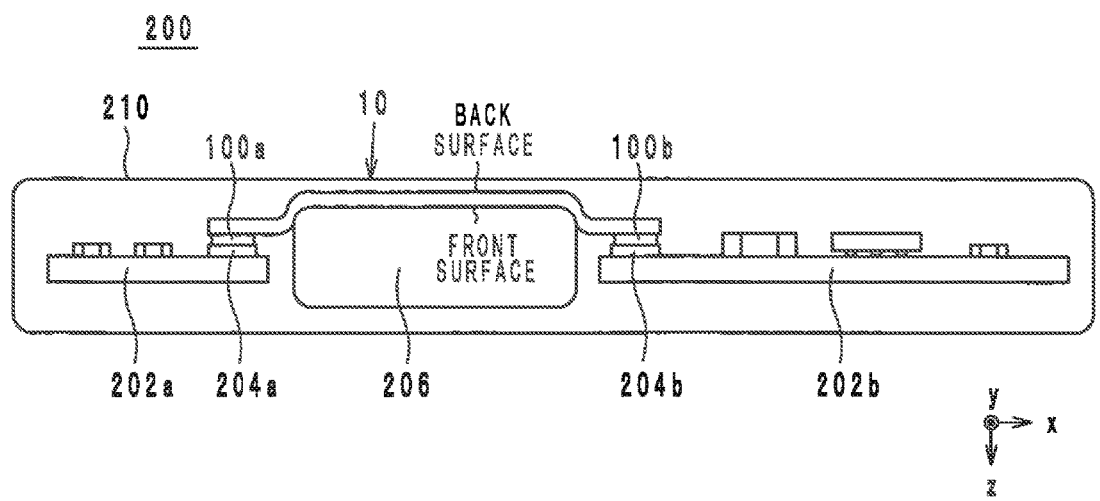
FIG. 7 is a plan view from a y-direction of an electronic device including the high-frequency signal transmission line.
Figure 8:
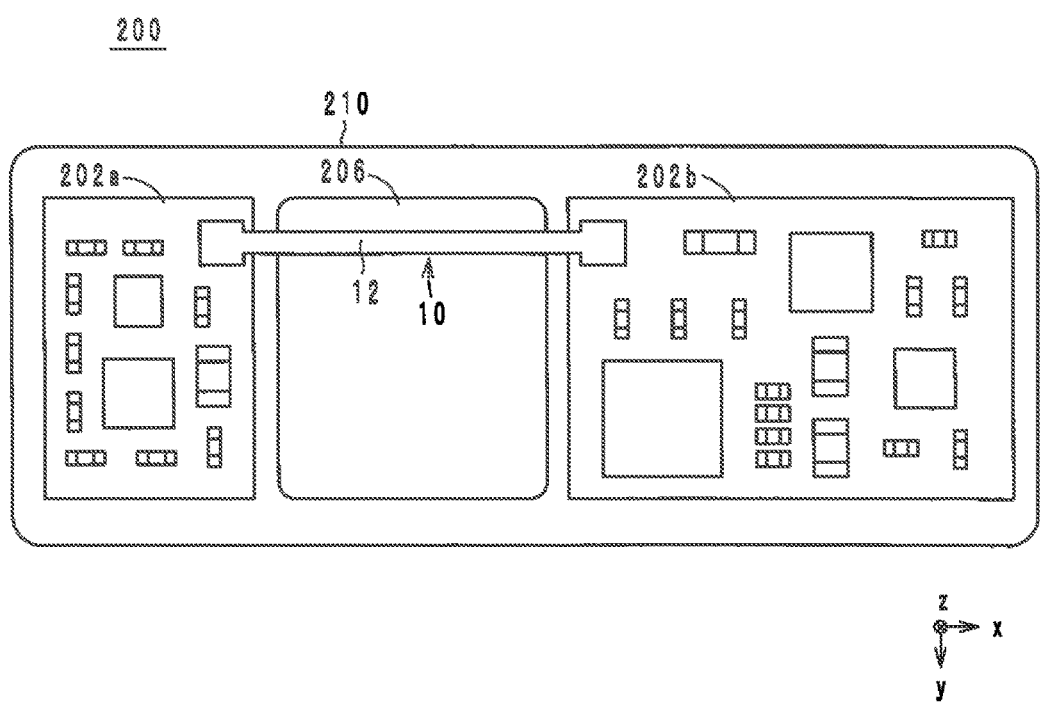
FIG. 8 is a plan view from a z-direction of the electronic device including the high-frequency signal transmission line.

The high-frequency signal transmission line 10 is preferably used in the following way. FIG. 7 is a plan view from the y-direction of an electronic device 200 including the high-frequency signal transmission line 10. FIG. 8 is a plan view from the z-direction of the electronic device 200 including the high-frequency signal transmission line 10.

The electronic device 200 includes the high-frequency signal transmission line 10, circuit boards 202a and 202b, receptacles 204a and 204b, a battery pack (metal object) 206, and a case 210.

The case 210 houses the high-frequency signal transmission line 10, the circuit boards 202a and 202b, the receptacles 204a and 204b, and the battery pack 206. In the circuit board 202a, for example, a transmitting circuit or a receiving circuit including an antenna is provided. In the circuit board 202b, for example, a feed circuit is provided. The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction.

The receptacles 204a and 204b are provided on respective main surfaces of the circuit boards 202a and 202b at the negative side in the z-direction. The connectors 100a and 100b are connected to the receptacles 204a and 204b, respectively. Thus, a high-frequency signal with a frequency of, for example, 2 GHz to be transmitted between the circuit boards 202a and 202b is applied to the central conductors 108 of the connectors 100a and 100b through the receptacles 204a and 204b. The respective external terminals 110 of the connectors 100a and 100b are maintained at the ground potential through the circuit boards 202a and 202b, and the receptacles 204a and 204b. In this way, the high-frequency signal transmission line 10 connects the circuit boards 202a and 202b to each other.

In this state, the front surface of the dielectric body 12 (specifically, the protective layer 14) is in contact with the battery 206, and the dielectric body 12 is fixed to the battery pack 206 by an adhesive. The front surface of the dielectric body 12 is the main surface of the dielectric body 12 located on the same side as the main ground conductor 22 relative to the signal line 20. Accordingly, the continuous main ground conductor 22 is located between the signal line 20 and the battery pack 206.

Figure 9:
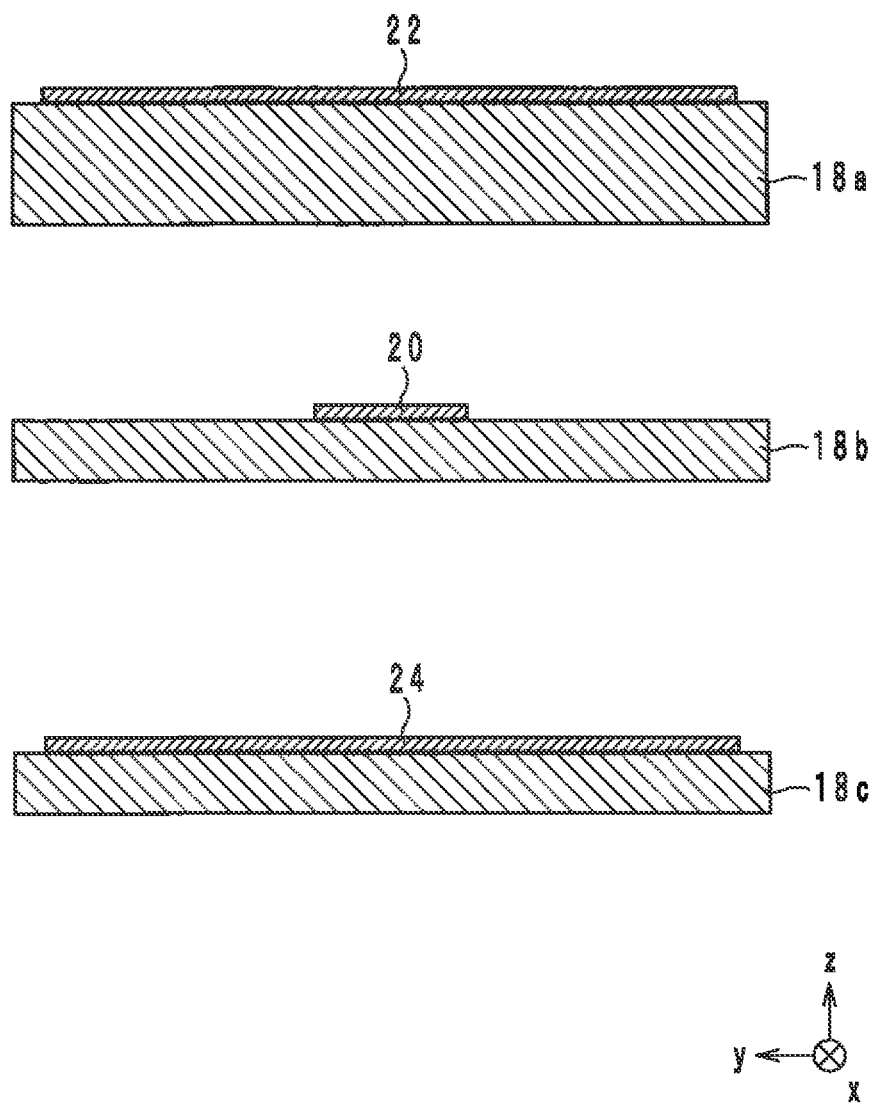
FIG. 9 is a sectional view of the dielectric body illustrating lamination thereof.
Figure 11:
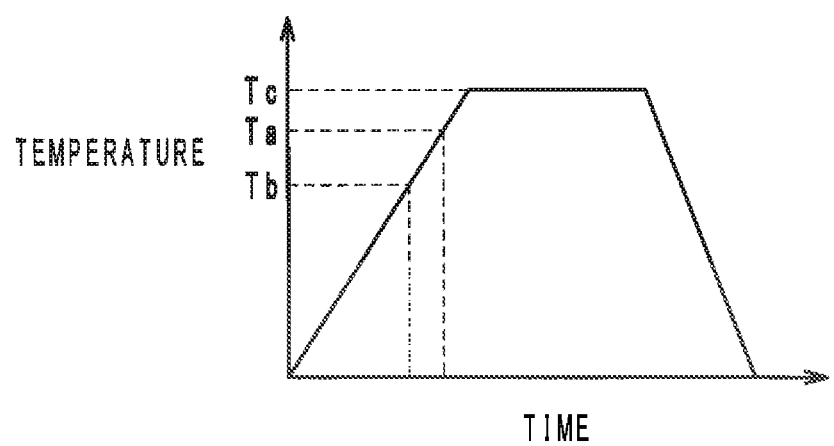
FIG. 11 is a graph depicting changes in the temperature of the dielectric body while the dielectric body undergoes a pressure-bonding process.

Next, a manufacturing method of the high-frequency signal transmission line 10 is described with reference to the drawings. In the following, a manufacturing method of one high-frequency signal transmission line 10 is described as an example. Practically, however, by stacking large-size dielectric sheets and by cutting the laminate, a plurality of high-frequency signal transmission lines are produced at one time. FIGS. 9 and 10 are sectional views illustrating lamination to form the dielectric body 12. FIG. 11 is a graph indicating changes in the temperature of the dielectric body 12 during a pressure-bonding process to form the dielectric body 12. In the graph, the y-axis indicates temperature, and the x-axis indicates time.

First, dielectric sheets, each formed of thermoplastic resin and having a copper foil (metal film) entirely on the front surface, are prepared as the dielectric sheets 18a through 18c. Specifically, copper foils are applied to the respective front surfaces of the dielectric sheets 18a through 18c. The surfaces of the copper foils are, for example, galvanized for corrosion proof and thus are smoothened. The dielectric sheets 18a through 18c are preferably formed of liquid polymer. The thicknesses of the copper foils are preferably within a range from about 10 μm to about 20 μm, for example.

Next, the external terminals 16a and 16b, and the main ground conductor 22 as illustrated in FIG. 2 are formed on the front surface of the dielectric sheet 18a preferably by patterning the copper foil formed on the front surface of the dielectric sheet 18a. Specifically, resists having identical shapes to the external terminals 16a and 16b, and the main ground conductor 22 are printed on the copper foil on the front surface of the dielectric sheet 18a. Then, the copper foil is etched, so that the portions of the copper foil not covered by the resists are removed. Thereafter, a resist remover is sprayed so as to remove the resists. In this way, the external terminals 16a and 16b, and the main ground conductor 22 as illustrated in FIG. 2 are formed on the front surface of the dielectric sheet 18a by photolithography.

Next, the signal line 20 as illustrated in FIG. 2 is formed on the front surface of the dielectric sheet 18b. Further, the auxiliary ground conductor 24 as illustrated in FIG. 2 is formed on the front surface of the dielectric sheet 18c. The process for forming the signal line 20 and the process for forming the auxiliary ground conductor 24 are the same as the process for forming the external terminals 16a and 16b, and the main ground conductor 22, and descriptions of the processes are omitted here.

Next, the dielectric sheets 18a and 18b are exposed to laser beams such that through holes are made in the dielectric sheets 18a and 18b at the positions of the via-hole conductors b1, b2 and B1 through B4. Thereafter, conductive paste is filled in the through holes, and thus, the via-hole conductors b1, b2 and B1 through B4 are formed.

Next, the dielectric sheet 18b is exposed to laser beams such that through holes are made in the dielectric sheet 18b at the positions of the subsidiary members 50. Thereafter, metal paste is filled in the through holes, and thus, the subsidiary members 50 are formed. The metal paste, which is the material of the subsidiary members 50, is a conductive material having a sintering point Tb lower than the softening point Ta of the dielectric sheets 18a through 18c. The metal paste is, for example, paste of a Sn—Cu-based material, paste of a Sn—Ag-based material or the like. The laser beam irradiation at the positions of the subsidiary members 50 may be carried out at the same step as the laser beam irradiation at the positions of the via-hole conductors b1, b2 and B1 through B4.

Next, as illustrated in FIGS. 9 and 10, the dielectric sheets 18a through 18c are stacked in this order from the positive side to the negative side in the z-direction to form the dielectric body 12. Then, the dielectric body 12 is pressed from the positive and negative sides in the z-direction and simultaneously heated to a temperature Tc. As indicated in FIG. 11, the temperature Tc is higher than the softening point Ta of the dielectric sheets 18a through 18c and higher than the sintering point Tb of the metal paste. Therefore, when the temperature of the dielectric body 12 rises to the temperature Tb, the metal paste sinters and turns into the subsidiary members 50. The subsidiary members 50 are more rigid than the dielectric sheets 18a through 18c. Therefore, during the pressing process, the dielectric sheets 18a through 18c are pressed and deformed in the z-direction, whereas the subsidiary members 50 are not deformed in the z-direction. Thus, the subsidiary members 50 push in the positive z-direction the central portion of the signal line 20 in the line-width direction, and the signal line 20 is curved as illustrated in FIG. 4. Further, when the temperature of the dielectric body 12 rises to the temperature Tb, the dielectric sheets 18a through 18c soften and flow. After the elapse of a predetermined time period from the moment when the dielectric body 12 rises to the temperature Tc, the heating of the dielectric body 12 is stopped. Then, the dielectric body 12 cools, and the dielectric sheets 18a through 18c solidify. In this way, the dielectric sheets 18a through 18c are fused together, and the dielectric body 12 is obtained.

Next, resin (resist) paste is applied to the front surface of the dielectric sheet 18a by screen printing, and thus, the protective layer 14 covering the main ground conductor 22 is formed.

Lastly, the connector 100a is mounted on the connecting portion 12b and soldered to the external terminal 16a and the terminal portion 22b, and the connector 100b is mounted on the connecting portion 12c and soldered to the external terminal 16b and the terminal portion 22c. Through the processes above, the high-frequency signal transmission line 10 as illustrated in FIG. 1 is manufactured.

In the high-frequency signal transmission line 10 having the structure above, a reduction in the insertion loss is achieved. Specifically, when a current flows in the signal line 20, lines of electric force are generated intensively from the side portions of the signal line 20 in the line-width direction to the ground conductor 22 because of an edge effect. The intensive generation of lines of electric force from the side portions of the signal line 20 results in intensive current flow in the side portions of the signal line 20 in the line-width direction. Accordingly, the area of the signal line 20 where the current flows is narrow, and the signal line 20 is difficult to pass an electric current.

In the high-frequency signal transmission line 10, as seen in the sectional view of FIG. 4, both side portions of the signal line 20 in the line-width direction are farther away from the main ground conductor 22 than the central portion of the signal line 20 in the line-width direction. Thus, the intensive generation of lines of electric force from the side portions of the signal line 20 in the line-width direction can be prevented. Accordingly, a current flows in a larger area of the signal line 20, and the signal line 20 becomes easy to pass an electric current. Thus, the high-frequency signal transmission line 10 achieves a significantly reduced insertion loss.

There is another reason for the reduced insertion loss of the high-frequency signal transmission line 10. Specifically, if in the areas where the signal line 20 overlaps with the bridges 60, the central portion of the signal line 20 in the line-width direction protrudes in the positive z-direction, the side portions of the signal line 20 in the line-width direction will be closer to the auxiliary ground conductor 24 than the central portion of the signal line 20 in the line-width direction. This will result in intensive generation of lines of electric force from the side portions of the signal line 20 in the line-width direction to the auxiliary ground conductor 24. However, as seen in FIGS. 2 and 3, the subsidiary members 50 do not overlap with the bridges 60, and therefore, in the areas where the signal line 20 overlaps with the bridges 60, the signal line 20 is not curved. Accordingly, intensive generation of lines of electric force from the both side portions of the signal line 20 in the line-width direction to the auxiliary ground conductor 24 is prevented. Consequently, a current flows in the whole signal line 20, and the signal line 20 becomes easier to pass an electric current. Thus, the high-frequency signal transmission line 10 achieves a significantly reduced insertion loss.

In the high-frequency signal transmission line 10, since the subsidiary members 50 are sintered bodies of metal paste, the areas where the subsidiary members 50 are provided are hard to bend. Therefore, the risk that bending of the dielectric body 12 causes a change in the distance between the signal line 20 and the main ground conductor 22 and/or a change in the distance between the signal line 20 and the auxiliary ground conductor 24 can be diminished. Consequently, the risk of a change in the characteristic impedance of the signal line 20 is significantly reduced or prevented.

In the high-frequency signal transmission line 10, the subsidiary members 50 are conductors and are electrically connected to the signal line 20. Therefore, the high-frequency signal transmission line 10 achieves a significantly reduced DC resistance value.

First Modification

Figure 12:
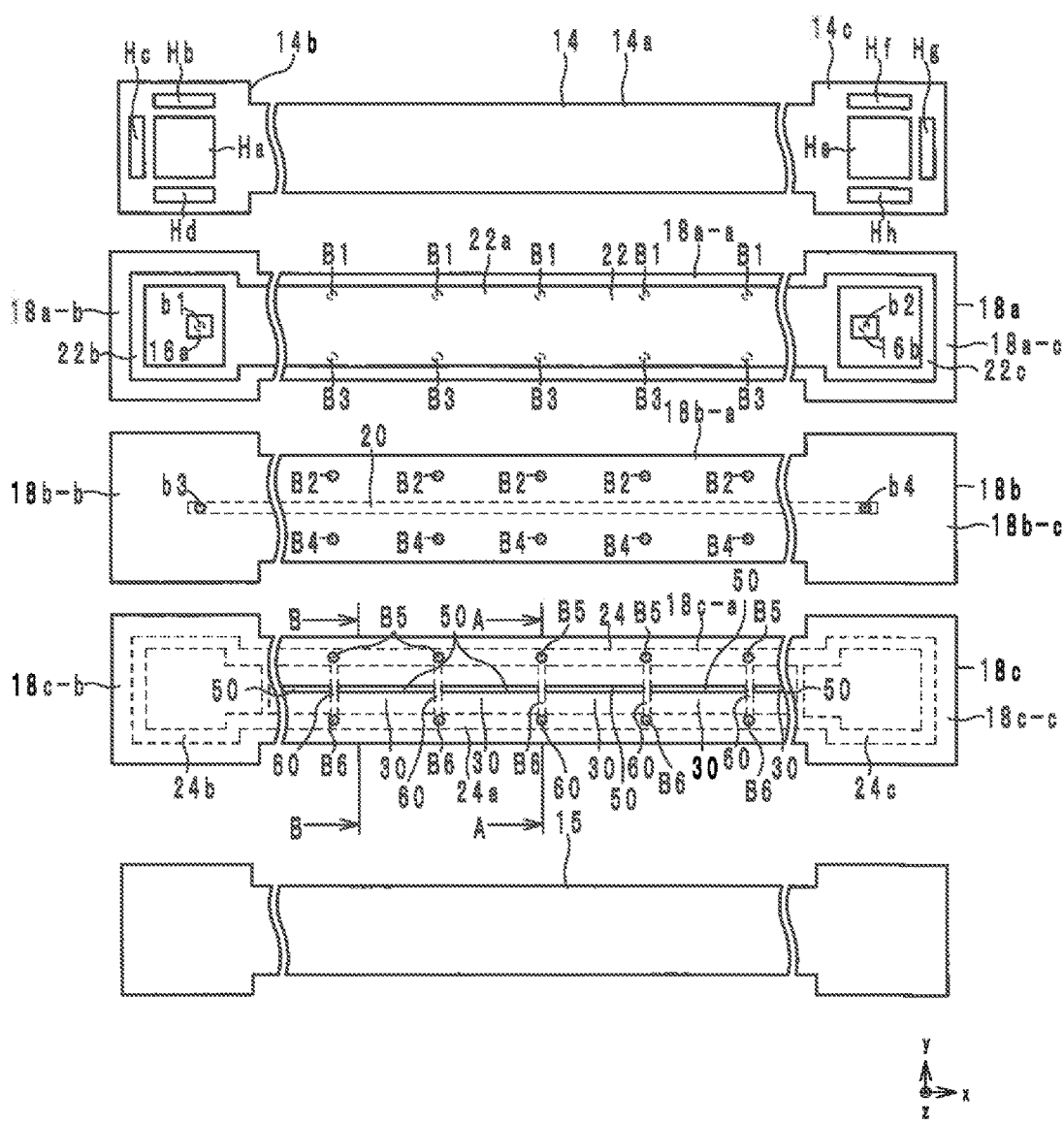
FIG. 12 is an exploded view of a dielectric body of a high-frequency signal transmission line according to a first modification of a preferred embodiment of the present invention.
Figure 13:
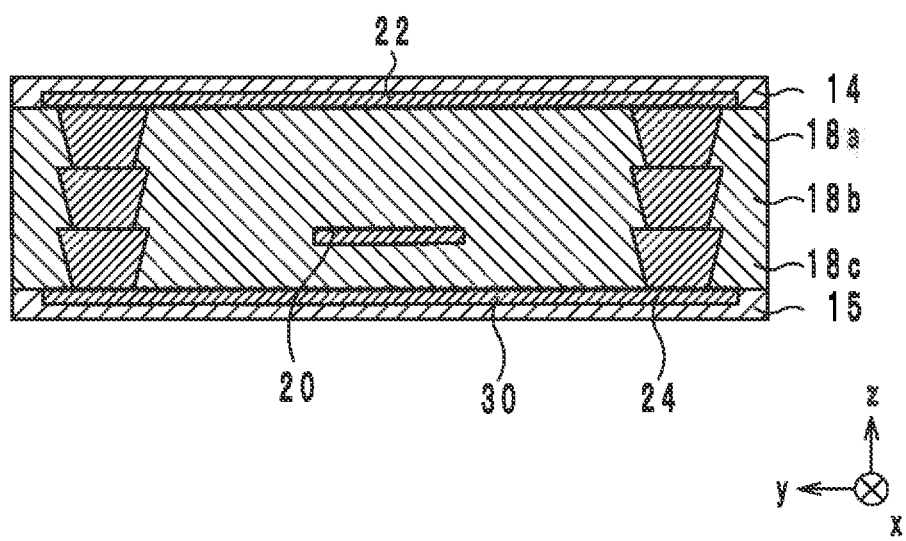
FIG. 13 is a sectional view of the high-frequency signal transmission line along the line A-A indicated in FIG. 12.
Figure 14:
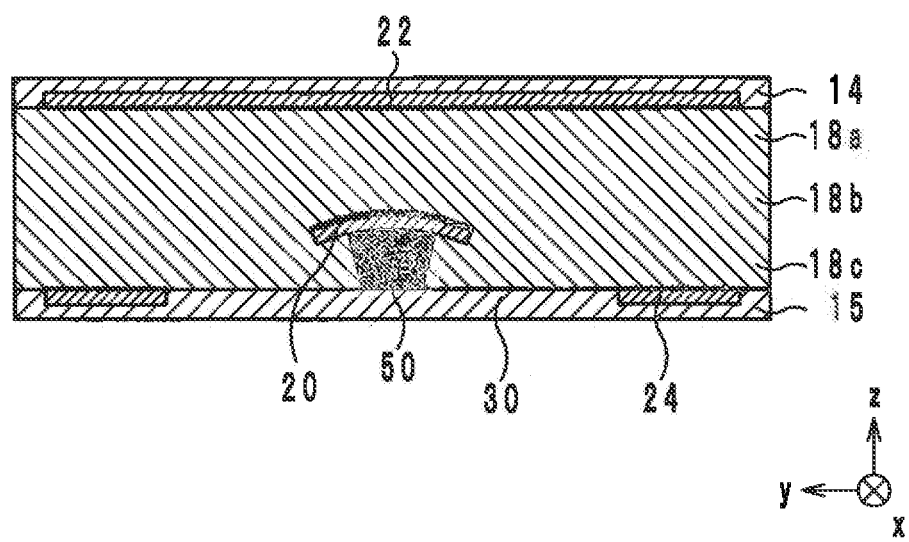
FIG. 14 is a sectional view of the high-frequency signal transmission line along the line B-B indicated in FIG. 12.

A high-frequency signal transmission line 10a according to a first modification of a preferred embodiment of the present invention is described with reference to the drawings. FIG. 12 is an exploded view of the dielectric body 12 of the high-frequency signal transmission line 10a according to the first modification. FIG. 13 is a sectional view of the high-frequency signal transmission line 10a along the line A-A indicated in FIG. 12. FIG. 14 is a sectional view of the high-frequency signal transmission line 10a along the line B-B indicated in FIG. 12. The appearance of the high-frequency signal transmission line 10a is as illustrated by the perspective view of FIG. 1.

The high-frequency signal transmission line 10a is different from the high-frequency signal transmission line 10 in the following points. The signal line 20 is provided on the back surface of the dielectric sheet 18b. The subsidiary members 50 are provided in the dielectric sheet 18c. The auxiliary ground conductor 24 is provided on the back surface of the dielectric sheet 18c. In the following, the high-frequency signal transmission line 10a is described focusing on the differences.

In the high-frequency signal transmission line 10a, the signal line 20 is provided on the back surface of the dielectric sheet 18b. The structure of the signal line 20 of the high-frequency signal transmission line 10a is the same as that of the signal line 20 of the high-frequency signal transmission line 10, and the structure of the signal line 20 is not described here.

In the high-frequency signal transmission line 10a, the auxiliary ground conductor 24 is provided on the back surface of the dielectric sheet 18c. The structure of the auxiliary ground conductor 24 of the high-frequency signal transmission line 10a is the same as that of the auxiliary ground conductor 24 of the high-frequency signal transmission line 10, and the structure of the auxiliary ground conductor 24 is not described here.

The high-frequency signal transmission line 10a further includes a protective layer 15 covering the back surface of the dielectric sheet 18c. The protective layer 15 is a portion of the dielectric body 12 and covers the auxiliary ground conductor 24.

The high-frequency signal transmission line 10a further includes via-hole conductors b3 and b4. The via-hole conductors b3 and b4 are pierced in the connecting portions 18b-b and 18b-c, respectively, of the dielectric sheet 18b in the z-direction. As seen in FIG. 12, the via-hole conductors b1 and b3 define one via-hole conductor to connect the negative end in the x-direction of the signal line 20 to the external terminal 16a. As seen in FIG. 12, the via-hole conductors b2 and b4 define one via-hole conductor to connect the positive end in the x-direction of the signal line 20 to the external terminal 16b.

The high-frequency signal transmission line 10a further includes via-hole conductors B5 and B6. The via-hole conductors B5 are pierced in the line portion 18c-a of the dielectric sheet 18c in the z-direction. As seen in FIG. 13, each set of adjacent via-hole conductors B1, B2 and B5 define one via-hole conductor to connect the main ground conductor 22 to the auxiliary ground conductor 24. As seen in FIG. 13, each set of adjacent via-hole conductors B3, B4 and B6 define one via-hole conductor to connect the main ground conductor 22 to the auxiliary ground conductor 24.

As seen in FIGS. 12 and 14, the subsidiary members 50 pierce the dielectric sheet 18c in the z-direction. Accordingly, the subsidiary members 50 are in contact with the signal line 20.

Since the subsidiary members 50 are provided, the signal line 20 is curved as illustrated in FIG. 14. Specifically, the central portion of the signal line 20 in the line-width direction overlaps with the subsidiary members 50. The subsidiary members 50 are preferably made of a more rigid material than the dielectric sheets 18a through 18c. Therefore, during a pressure-bonding process to form the dielectric body 12, the subsidiary members 50 push in the positive z-direction the central portion of the signal line 20 in the line-width direction. As a result, in a sectional view along a plane perpendicular or substantially perpendicular to the extending direction of the signal line 20 (x-direction), the signal line 20 is curved such that the both side portions of the signal line 20 in the line-width direction are farther away from the main ground conductor 22 than the central portion thereof. Thus, the signal line 20 is curved such that the central portion in the line-width direction protrudes in the positive z-direction. The structures of the other portions of the high-frequency signal transmission line 10a are similar to those of the high-frequency signal transmission line 10, and these portions are not described here.

Figure 15:
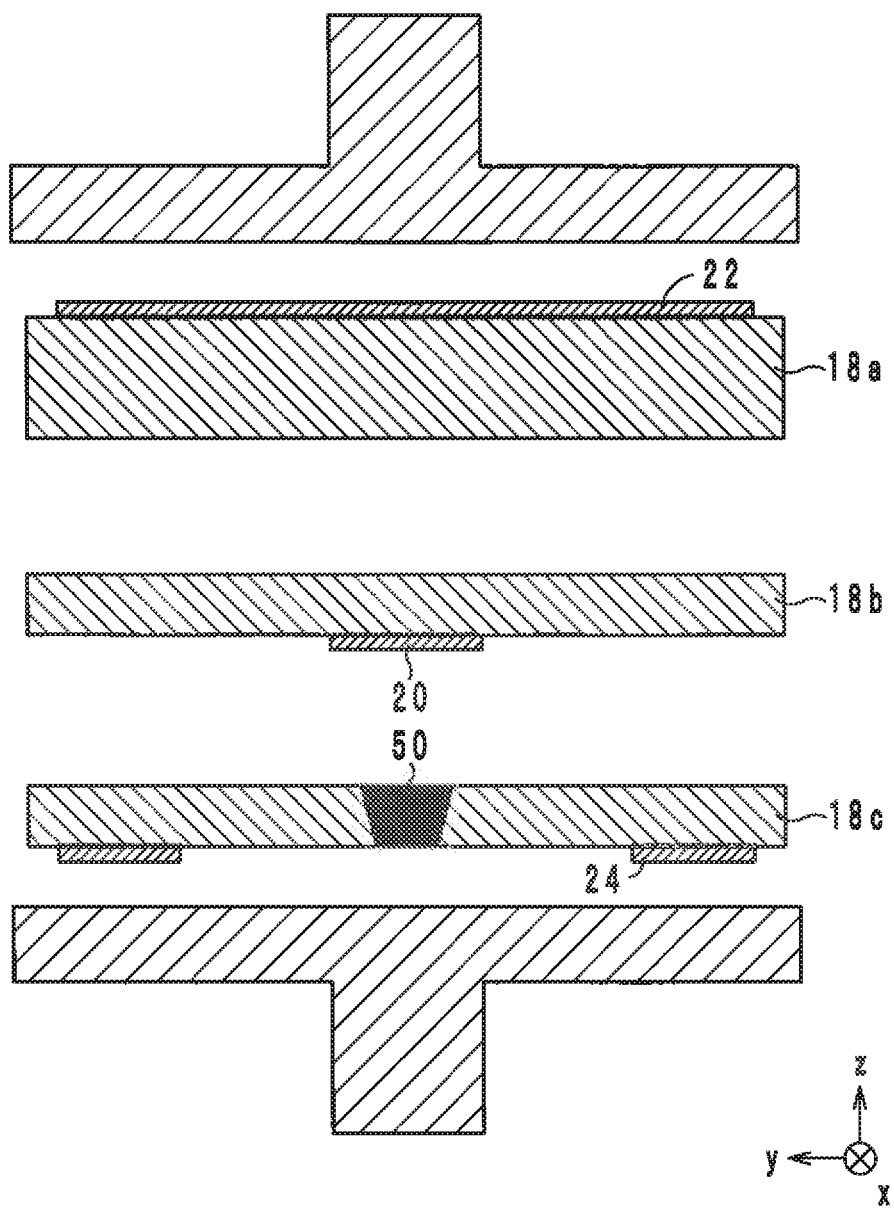
FIG. 15 is a sectional view of the dielectric body illustrating lamination thereof.
Figure 16:
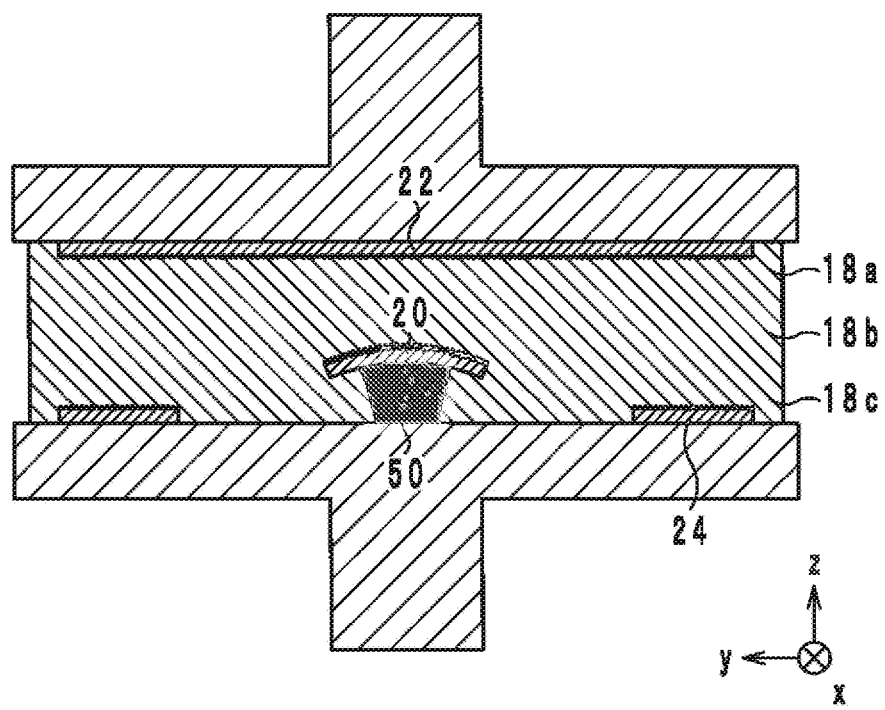
FIG. 16 is a sectional view of the dielectric body illustrating lamination thereof.

Next, a manufacturing method of the high-frequency signal transmission line 10a is described with reference to the drawings. FIGS. 15 and 16 are sectional views illustrating lamination performed to form the dielectric body 12.

First, dielectric sheets, each formed of thermoplastic resin and having a copper foil (metal film) disposed entirely on one main surface, are prepared as the dielectric sheets 18a through 18c. The process to prepare the dielectric sheets 18a through 18c for the high-frequency signal transmission line 10a is similar to the process to prepare the dielectric sheets 18a through 18c for the high-frequency signal transmission line 10, and the process is not described here.

Next, the external terminals 16a and 16b, and the main ground conductor 22 as illustrated in FIG. 12 are formed on the front surface of the dielectric sheet 18a by patterning the copper foil formed on the upper surface of the dielectric sheet 18a. The signal line 20 as illustrated in FIG. 12 is formed on the back surface of the dielectric sheet 18b. Further, the auxiliary ground conductor 24 as illustrated in FIG. 12 is formed on the back surface of the dielectric sheet 18c. The processes to form the external terminals 16a and 16b, the signal line 20, the main ground conductor 22 and the auxiliary ground conductor 24 of the high-frequency signal transmission line 10a are similar to the processes to form the external terminals 16a and 16b, the signal line 20, the main ground conductor 22 and the auxiliary ground conductor 24 of the high-frequency signal transmission line 10, and these processes are not described here.

Next, the dielectric sheets 18a, 18b and 18c are exposed to laser beams such that through holes are made in the dielectric sheets 18a, 18b and 18c at the positions of the via-hole conductors b1, b2 and B1 through B6. Thereafter, conductive paste is filled in the through holes, and thus, the via-hole conductors b1, b2 and B1 through B6 are formed.

Next, the dielectric sheet 18c is exposed to laser beams such that through holes are made in the dielectric sheet 18c at the positions of the subsidiary members 50. Thereafter, metal paste is filled in the through holes, and thus, the subsidiary members 50 are formed.

Next, as illustrated in FIG. 15, the dielectric sheets 18a through 18c are stacked in this order from the positive side to the negative side in the z-direction to form the dielectric body 12. Then, as illustrated in FIG. 16, the dielectric body 12 is pressed from the positive and the negative sides in the z-direction and simultaneously heated. In this way, the dielectric body 12 is obtained.

Next, resin (resist) paste is applied to the front surface of the dielectric sheet 18a by screen printing, and thus, the protective layer 14 covering the main ground conductor 22 is formed. Further, resin (resist) paste is applied to the back surface of the dielectric sheet 18c by screen printing, and thus, the protective layer 15 covering the auxiliary ground conductor 24 is formed.

Lastly, the connector 100a is mounted on the connecting portion 12b and soldered to the external terminal 16a and the terminal portion 22b, and the connector 100b is mounted on the connecting portion 12c and soldered to the external terminal 16b and the terminal portion 22c. Through the processes above, the high-frequency signal transmission line 10a as illustrated in FIG. 1 is manufactured.

As the high-frequency signal transmission line 10, the high-frequency signal transmission line 10a having the structure above has a reduced insertion loss.

Second Modification

Figure 17:
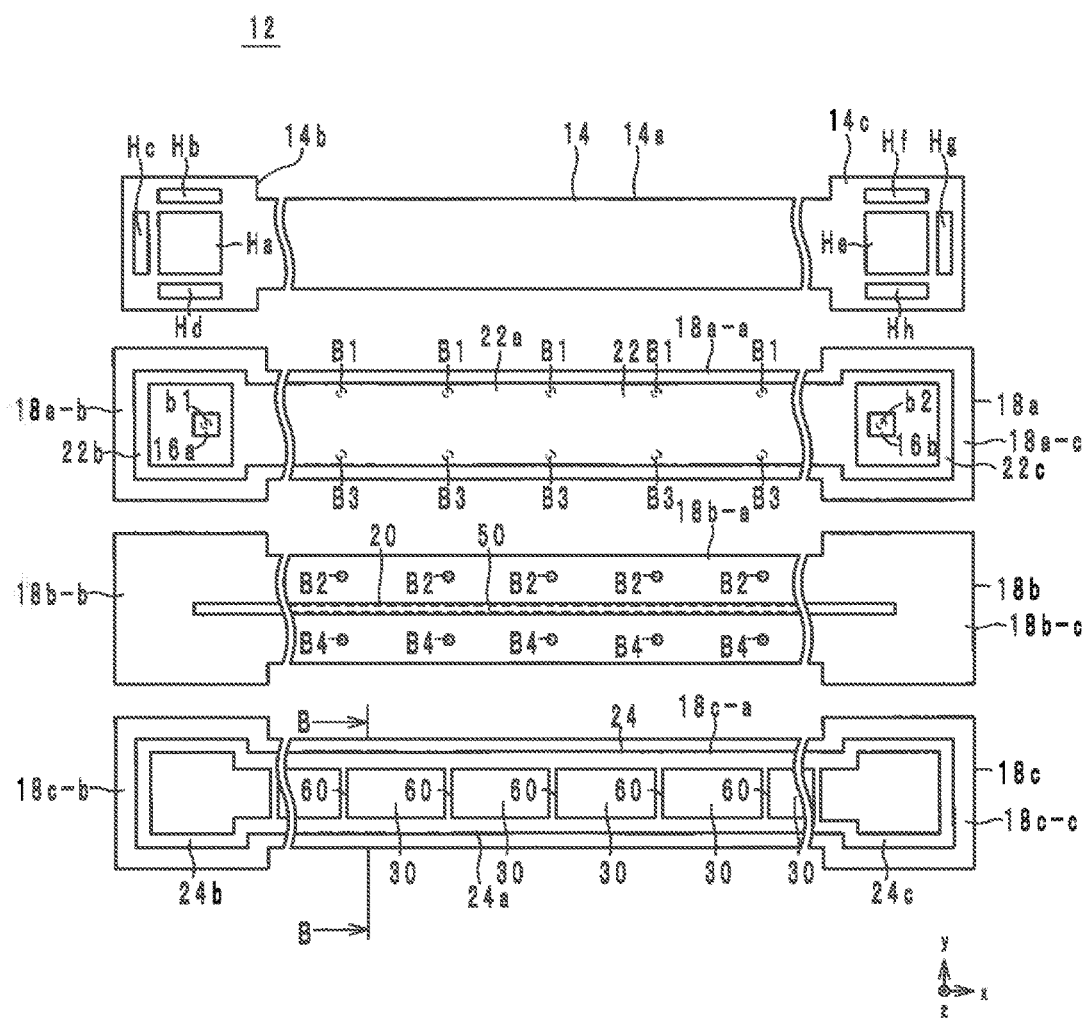
FIG. 17 is an exploded view of a dielectric body of a high-frequency signal transmission line according to a second modification of a preferred embodiment of the present invention.

A high-frequency signal transmission line 10b according to a second modification of a preferred embodiment of the present invention is described with reference to the drawings. FIG. 17 is an exploded view of the high-frequency signal transmission line 10b according to the second modification. FIG. 18 is a sectional view of the high-frequency signal transmission line 10b along the line B-B indicated in FIG. 17. The appearance of the high-frequency signal transmission line 10b is as illustrated by the perspective view of FIG. 1.

The high-frequency signal transmission line 10b is different from the high-frequency signal transmission line 10 in the material and the structure of the subsidiary members 50. Specifically, as seen in FIGS. 17 and 18, the subsidiary members 50 are located between the dielectric sheet 18b and the dielectric sheet 18c. The subsidiary members 50 are not embedded in either of the dielectric sheets 18b and 18c.

The subsidiary members 50 are preferably formed of resin, which is insulating, and therefore, the subsidiary members 50 preferably are configured also to overlap with the bridges 60. Accordingly, in the second modification, the subsidiary members are provided as one stick-shaped member extending in the x-direction. The stick-shaped subsidiary member 50 is preferably formed of a material that will not melt under heat during a pressure-bonding process to form the dielectric body 12. The subsidiary member 50 is preferably formed of, for example, epoxy resin. The structures of the other portions of the high-frequency signal transmission line 10b are similar to those of the high-frequency signal transmission line 10, and these portions are not described here.

Figure 19:
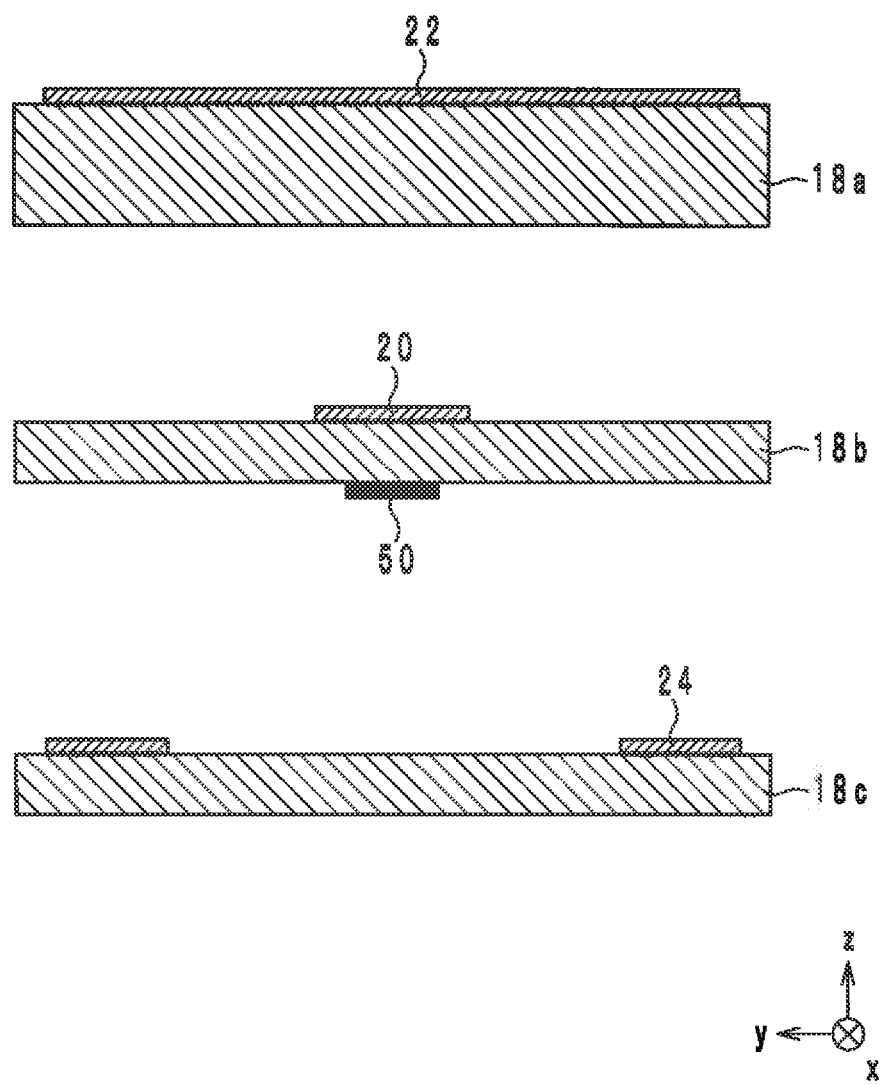
FIG. 19 is a sectional view of a high-frequency signal transmission line according to a third modification of a preferred embodiment of the present invention along the line B-B.

Next, a non-limiting example of a manufacturing method of the high-frequency signal transmission line 10b is described with reference to the drawings. FIG. 19 is a sectional view illustrating lamination performed to form the dielectric body 12.

First, the dielectric sheets 18a through 18c are prepared. The process to prepare the dielectric sheets 18a through 18c for the high-frequency signal transmission line 10b is similar to the process to prepare the dielectric sheets 18a through 18c for the high-frequency signal transmission line 10, and the process is not described here.

Next, the external terminals 16a and 16b, and the main ground conductor 22 as illustrated in FIG. 17 are formed on the front surface of the dielectric sheet 18a by patterning the copper foil formed on the upper surface of the dielectric sheet 18a. The signal line 20 as illustrated in FIG. 17 is formed on the front surface of the dielectric sheet 18b. Further, the auxiliary ground conductor 24 as illustrated in FIG. 17 is formed on the front surface of the dielectric sheet 18c. The processes to form the external terminals 16a and 16b, the signal line 20, the main ground conductor 22 and the auxiliary ground conductor 24 of the high-frequency signal transmission line 10b are similar to the processes to form the external terminals 16a and 16b, the signal line 20, the main ground conductor 22 and the auxiliary ground conductor 24 of the high-frequency signal transmission line 10, and these processes are not described here.

Next, the dielectric sheets 18a and 18b are exposed to laser beams such that through holes are made in the dielectric sheets 18a and 18b at the positions of the via-hole conductors b1, b2 and B1 through B4. Thereafter, conductive paste is filled in the through holes, and thus, the via-hole conductors b1, b2 and B1 through B4 are formed.

Next, the dielectric sheets 18a through 18c are stacked in this order from the positive side to the negative side in the z-direction to form the dielectric body 12. In this moment, as illustrated in FIG. 19, the subsidiary member 50 is placed on the back surface of the dielectric sheet 18b. Then, the dielectric body 12 is pressed from the positive and the negative sides in the z-direction and simultaneously heated. In this way, the dielectric body 12 is obtained.

Next, resin (resist) paste is applied to the front surface of the dielectric sheet 18a preferably by screen printing, and thus, the protective layer 14 covering the main ground conductor 22 is formed.

Lastly, the connector 100a is mounted on the connecting portion 12b and soldered to the external terminal 16a and the terminal portion 22b, and the connector 100b is mounted on the connecting portion 12c and soldered to the external terminal 16b and the terminal portion 22c. Through the processes above, the high-frequency signal transmission line 10b as illustrated in FIG. 1 is manufactured.

As the high-frequency signal transmission line 10, the high-frequency signal transmission line 10b having the structure above achieves a significantly reduced insertion loss.

The subsidiary member 50 is not necessarily a stick-shaped resin member. The subsidiary member 50 may be formed by printing paste containing epoxy resin or any other resin on the back surface of the dielectric sheet 18b and by hardening the paste.

In the high-frequency signal transmission line 10b, if the subsidiary member 50 is formed of a relatively rigid material, the dielectric body 12 is hard to bend. On the other hand, if the subsidiary member 50 is formed of a relatively soft material, the dielectric body 12 is easy to bend. Thus, it is possible to adjust the flexibility of the dielectric body 12 by adjusting the composition of the material of the subsidiary member 50.

Third Modification

Figure 20:
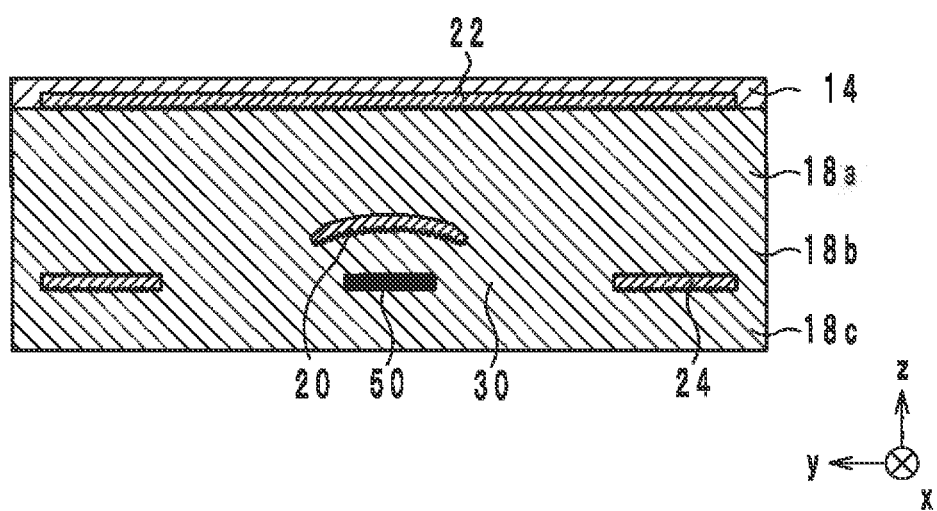
FIG. 20 is a sectional view of a dielectric body illustrating lamination thereof.
Figure 21:
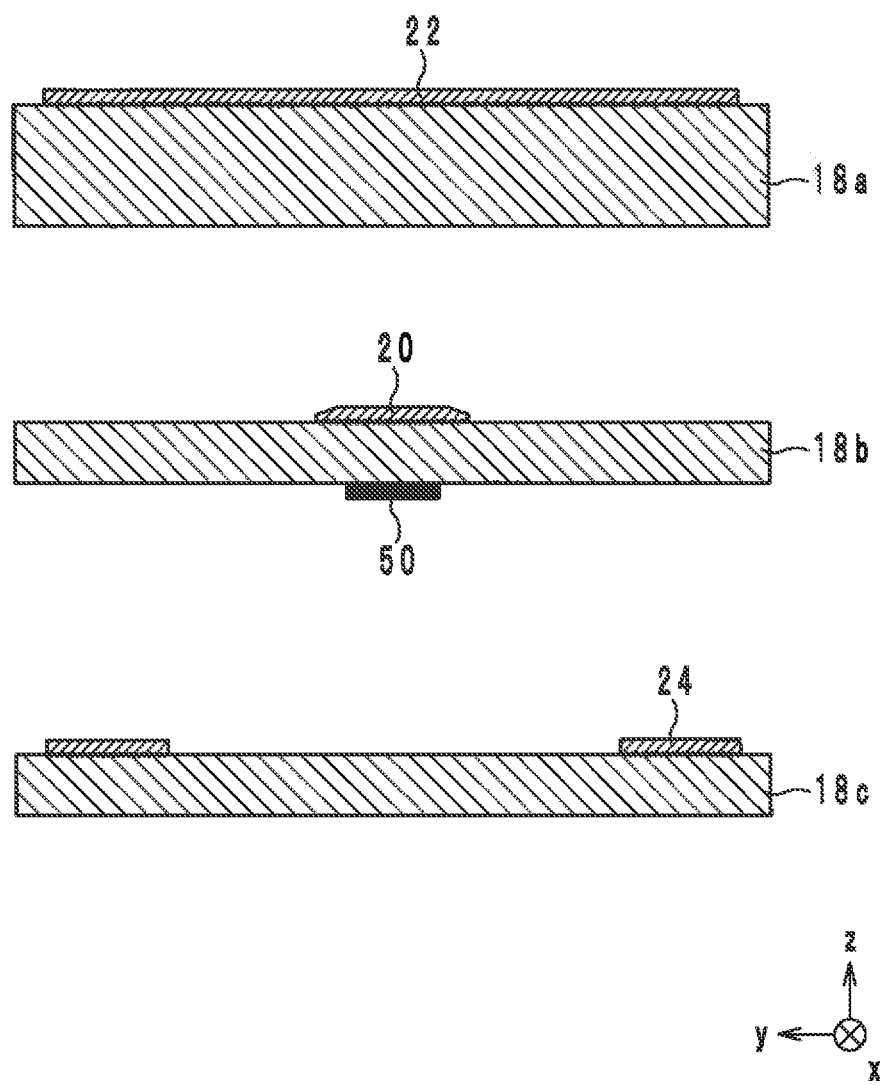
FIG. 21 is a sectional view of the dielectric body illustrating lamination thereof.

A high-frequency signal transmission line 10c according to a third modification of a preferred embodiment of the present invention is described with reference to the drawings. FIG. 20 is a sectional view of the high-frequency signal transmission line 10c according to the third modification along the line B-B. FIG. 21 is a sectional view illustrating lamination performed to form the dielectric body 12. The appearance of the high-frequency signal transmission line 10c is as illustrated by the perspective view of FIG. 1. The internal structure of the high-frequency signal transmission line 10c is as illustrated by the exploded view of FIG. 17.

The high-frequency signal transmission line 10c is different from the high-frequency signal transmission line 10 in the cross-sectional shape of the signal line 20. As illustrated in FIGS. 20 and 21, the signal line 20 has a cross-sectional shape having chamfered corners at the positive side in the z-direction. Accordingly, the thickness of the signal line 20 becomes smaller with increasing distance from the center thereof in the line-width direction and with decreasing distance from each of the sides thereof in the line-width direction. Such a shape can be achieved by adjusting the conditions for etching of the copper film (metal film), for example.

A non-limiting example of a manufacturing method of the high-frequency signal transmission line 10c is similar to the manufacturing method of the high-frequency signal line 10b, and the method is not described here.

As the high-frequency signal transmission line 10b, the high-frequency signal transmission line 10c achieves a significantly reduced insertion loss.

In the high-frequency signal transmission line 10c, the thicknesses of the side portions of the signal line 20 in the line-width direction are smaller than the thickness of the central portion of the signal line 20 in the line-width direction. Therefore, the portions of the dielectric sheets 18b and 18c around the both side portions of the signal line 20 in the line-width direction are prevented from deforming during a pressure-bonding process to form the dielectric body 12. Consequently, the risk of deformation of the main ground conductor 22 and the auxiliary ground conductor 24 due to deformation of the dielectric sheets 18b and 18c is significantly decreased or prevented.

In the high-frequency signal transmission line 10c, as illustrated in FIG. 20, both sides of the signal line 20 in the line-width direction are located still farther from the main ground conductor 22. Therefore, intensive generation of lines of electric force from the both sides of the signal line 20 in the line-width direction to the main ground conductor 22 is prevented more effectively. Consequently, the high-frequency signal transmission line 10c achieves a further reduced insertion loss.

Fourth Modification

Figure 22:
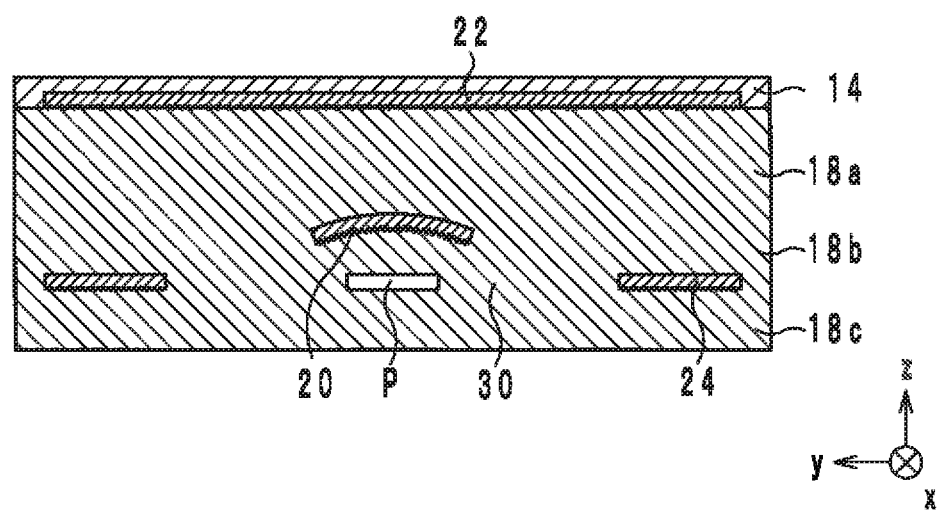
FIG. 22 is a sectional view of a high-frequency signal transmission line according to a fourth modification of a preferred embodiment of the present invention along the line B-B.

A high-frequency signal transmission line 10d according to a fourth modification of a preferred embodiment of the present invention is described with reference to the drawings. FIG. 22 is a sectional view of the high-frequency signal transmission line 10d according to the fourth modification along the line B-B. The appearance of the high-frequency signal transmission line 10d is as illustrated by the perspective view of FIG. 1. The internal structure of the high-frequency signal transmission line 10d is as illustrated by the exploded view of FIG. 17.

The high-frequency signal transmission line 10d is different from the high-frequency signal transmission line 10b in that the subsidiary member 50 is not provided in the high-frequency signal transmission line 10d. In the high-frequency signal transmission line 10d, a hollow space P is provided at the position of the subsidiary member 50 in the high-frequency signal transmission line 10b. The hollow space P results from disappearance of the subsidiary member 50 during a pressure-bonding process to form the dielectric body 12. The structures of the other portions of the high-frequency signal transmission line 10d are similar to those of the high-frequency signal transmission line 10b, and these portions are not described here.

Next, a non-limiting example of a manufacturing method of the high-frequency signal transmission line 10d is described with reference to the drawings. The manufacturing method of the high-frequency signal transmission line 10d is different from the manufacturing method of the high-frequency signal transmission line 10b in the material of the subsidiary member 50. In the following, the manufacturing method of the high-frequency signal transmission line 10d is described focusing on the difference.

The dielectric sheets 18a through 18c are stacked in this order from the positive side to the negative side in the z-direction. In this moment, as illustrated in FIG. 22, the subsidiary member 50 is placed on the back surface of the dielectric sheet 18b. The subsidiary member 50 is formed of a material that will disappear under heat during a pressure-bonding process to form the dielectric body 12. However, the subsidiary member 50 does not disappear at the softening point Ta of the dielectric sheets 18a through 18c. For example, a carbon-based material can be used as the material of the subsidiary member 50. The dielectric body 12 is pressed from the positive and the negative sides in the z-direction and simultaneously heated. In this moment, the subsidiary member 50 pushes in the positive z-direction the central portion of the signal line 20 in the line-width direction so as to curve the signal line 20 as illustrated in FIG. 22. Thereafter, the subsidiary member 50 disappears. In this way, the dielectric body 12 preferably is obtained. The other processes in the manufacturing method of the high-frequency signal transmission line 10d are similar to those in the manufacturing method of the high-frequency signal transmission line 10b, and the processes are not described here.

As the high-frequency signal transmission line 10b, the high-frequency signal transmission line 10d achieves a significantly reduced insertion loss.

In the high-frequency signal transmission line 10d, the hollow space P is located at the negative side in the z-direction of the signal line 20. The relative permittivity of the hollow space P is lower than that of the dielectric body 12, and the dielectric loss at the hollow space P is relatively small. Accordingly, the high-frequency signal transmission line 10d has an enhanced high-frequency characteristic.

Other Preferred Embodiments

High-frequency signal transmission lines according to the present invention are not limited to the high-frequency signal transmission lines 10 and 10a through 10d, and various changes and modifications are possible within the scope of the present invention.

The structures of the high-frequency signal transmission lines 10 and 10a through 10d may be combined with each other.

In the preferred embodiments above, the protective layer 14 is preferably formed by screen printing. However, the protective layer 14 may be formed by photolithography.

The connectors 100a and 100b are not indispensable for the high-frequency signal transmission lines 10 and 10a through 10d. In a case where the connectors 100a and 100b are not provided, both ends of each of the high-frequency signal transmission lines 10 and 10a through 10d are connected to circuit boards by solder or the like. Each of the high-frequency signal transmission lines 10 and 10a through 10d may include only one connector 100a provided at only one end thereof.

Instead of the via-hole conductors, through-hole conductors may be used. A through-hole conductor is an interlayer connection conductor obtained by forming a conductor, by plating or the like, on the inner surface of a through hole made in the dielectric body 12.

The openings 30 are not necessarily made in the auxiliary ground conductor 24. Also, the auxiliary ground conductor 24 is not necessarily provided.

Each of the high-frequency signal transmission lines 10, 10a through 10d may be used as a high-frequency signal transmission line in an RF circuit board such as an antenna front-end module.

As thus far described, preferred embodiments of the present invention are useful in a high-frequency signal transmission line, an electronic device and a manufacturing method of the high-frequency signal transmission line, and preferred embodiments of the present invention achieve the advantage of reducing the insertion loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a high-frequency signal transmission line including a dielectric body including dielectric layers stacked together, a linear signal line provided in the dielectric body, a first ground conductor provided at the dielectric body at a first side of the signal line in a stacking direction so as to face the signal line, and a subsidiary member provided at the dielectric body, at a second side of the signal line in the stacking direction so as to face a central portion of the signal line in a line-width direction; wherein
while the dielectric body is pressed from both sides in the stacking direction, the subsidiary member presses the central portion of the signal line in the line-width direction to curve the signal line.

2. The method for manufacturing according to claim 1, wherein the subsidiary member extends along the signal line and has a line width smaller than a line width of the signal line.

3. The method for manufacturing according to claim 1, wherein the subsidiary member is more rigid than the dielectric layers.

4. The method for manufacturing according to claim 1, wherein the subsidiary member is conductive and is electrically connected to the signal line.

5. The method for manufacturing according to claim 1, wherein while the dielectric body is pressed from both sides in the stacking direction, the dielectric body is heated so as to fuse the dielectric layers together.

6. The method for manufacturing according to claim 5, wherein the subsidiary member is formed of a conductive material that sinters at a temperature lower than a temperature at which the dielectric layers fuse.

7. The method for manufacturing according to claim 5, wherein the subsidiary member is formed of a material that does not fuse while the dielectric body is heated.

* * * * *